US012656387B2

(12) United States Patent
Hiscock et al.

(10) Patent No.: US 12,656,387 B2
(45) Date of Patent: Jun. 16, 2026

(54) DISTANCE ESTIMATION FOR MULTIPLE DEVICES ON A TRANSMISSION LINE USING CONTROLLABLE SHORTS

(71) Applicant: QUALCOMM Incorporated, San Diego, CA (US)

(72) Inventors: Paul Dominic Hiscock, Cambridge (GB); Ilia Feldman, Ely (GB)

(73) Assignee: QUALCOMM Incorporated, San Diego, CA (US)

( * ) Notice: Subject to any disclaimer, the term of this patent is extended or adjusted under 35 U.S.C. 154(b) by 182 days.

(21) Appl. No.: 18/429,097

(22) Filed: Jan. 31, 2024

(65) Prior Publication Data

US 2025/0244375 A1     Jul. 31, 2025

(51) Int. Cl.
*G01R 31/11*      (2006.01)
*G01R 31/08*      (2020.01)
*G01R 31/52*      (2020.01)

(52) U.S. Cl.
CPC ............ *G01R 31/11* (2013.01); *G01R 31/085* (2013.01); *G01R 31/52* (2020.01)

(58) Field of Classification Search
CPC ...... G01R 31/11; G01R 31/085; G01R 31/52; H04B 3/46
See application file for complete search history.

(56) References Cited

U.S. PATENT DOCUMENTS 5,717,337 A * 2/1998 Kelly ...................... G01F 23/28
                                                            73/304 R
10,326,494 B2    6/2019    Rappaport et al.

2002/0015342 A1*  2/2002  Kuge ..................... G11C 5/063
                                                          365/201
2003/0112020 A1*  6/2003  Yankielun .............. B64D 15/20
                                                          324/644
2007/0035380 A1*  2/2007  Overhultz ........... G06Q 10/087
                                                          340/539.22
2011/0304340 A1* 12/2011  Hall ...................... G01R 31/11
                                                          324/533
2013/0191066 A1*  7/2013  Spillane ................. G01K 1/024
                                                          702/135
2022/0182057 A1*  6/2022  Hamamoto ........ H03K 19/0005
2022/0335862 A1* 10/2022  Rössl ................... G06K 7/0008
2023/0118013 A1    4/2023  Hiscock et al.
2025/0277838 A1*  9/2025  Maeda .................... G06F 30/20

OTHER PUBLICATIONS

International Search Report and Written Opinion PCT/US2024/059062 ISA/EPO Apr. 14, 2025.

* cited by examiner

*Primary Examiner* — Akm Zakaria
(74) *Attorney, Agent, or Firm* — Polsinelli

(57)                    ABSTRACT

Systems and techniques are provided for distance estimation. A first pulse signal injected into a first end of a transmission line can reflect off a first short caused across the transmission line by a first device. A peak voltage of a first difference signal corresponding to the reflection can be measured. A second pulse signal injected into the transmission line by the first device can reflect off a second short caused across the transmission line by a second device farther from the first end than the first device. A peak voltage of a second difference signal corresponding to the reflection of the second pulse signal can be measured. The location of the first device along the transmission line can be determined based on a first distance estimate using the peak voltage of the first difference signal and a second distance estimate using the peak voltage of the second difference signal.

20 Claims, 13 Drawing Sheets

1000 ⟋

100

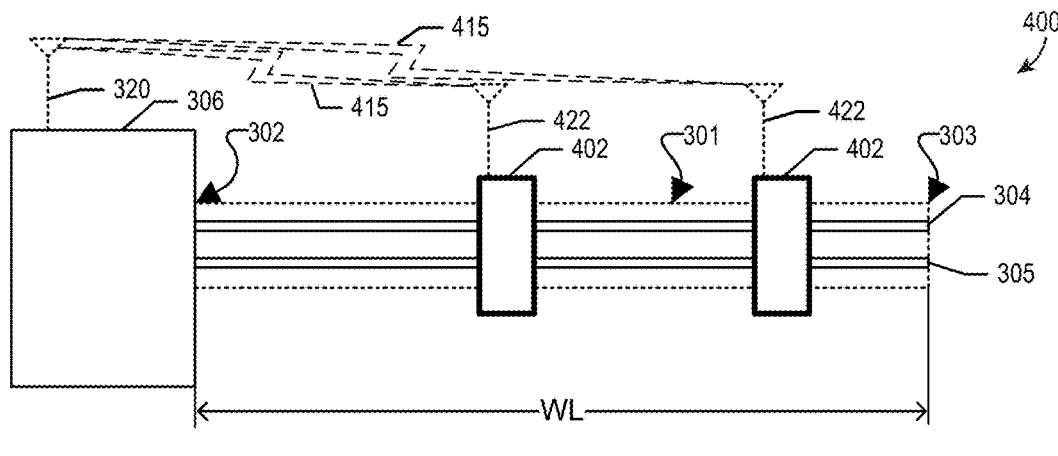
FIG. 4A
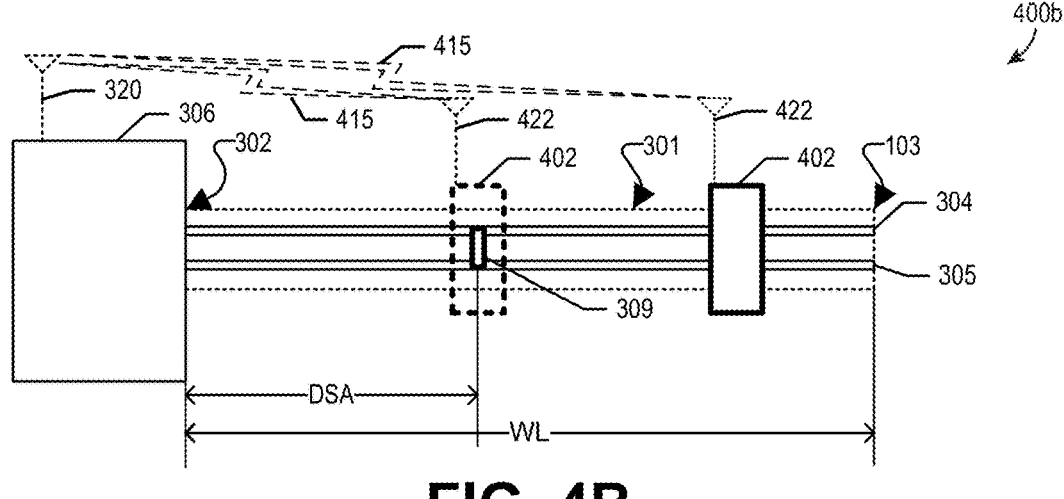
FIG. 4B
FIG. 4C

900a

910

920

930

901

Peak Detect Circuit
(transmits pulse)

Device
Shorts Rail

900b

910

922

930

927

960

901

924

Peak Detect Circuit

Device
Transmits
Pulse

Controllable Short

DISTANCE ESTIMATION FOR MULTIPLE DEVICES ON A TRANSMISSION LINE USING CONTROLLABLE SHORTS

FIELD

Aspects of the present disclosure generally relate to wireless communications. For example, aspects of the present disclosure relate to using controllable shorts to detect and locate the position of multiple devices along a transmission line in a synchronization system including one or more network devices (e.g., central devices, such as access points (APs)) and one or more wireless communication devices (e.g., peripheral devices, such as electronic shelf labels (ESLs)).

BACKGROUND

Short range wireless communication enables wireless communication over relatively short distances (e.g., within thirty meters). For example, BLUETOOTH® is a wireless technology standard for exchanging data over short distances using short-wavelength ultra-high frequency (UHF) radio waves from 2.4 gigahertz (GHz) to 2.485 GHz.

BLUETOOTH® Low Energy (BLE) is a form of BLUETOOTH® communication that allows for communication with devices running on low power. Such devices may include beacons, which are wireless communication devices that may use low-energy communication technology for positioning, proximity marketing, or other purposes. In some cases, such devices may serve as nodes (e.g., relay nodes) of a wireless mesh network that communicates and/or relays information to a managing platform or hub associated with the wireless mesh network.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

Disclosed are systems, methods, apparatuses, and computer-readable media for performing wireless communication. According to at least one illustrative example, a method for wireless communications by a wireless communication device is provided. The method includes: configuring a first device of a plurality of devices attached to a transmission line to create a first short across the transmission line at a location of the first device along a length of the transmission line, wherein each device of the plurality of devices is attached to a respective location along the length of the transmission line between a first end and a second end of the transmission line; injecting a first pulse signal into the first end of the transmission line; measuring a peak voltage of a first difference signal at the first end of the transmission line, the first difference signal resulting from a reflection of the first pulse signal by the first short; configuring a second device attached to the transmission line to create a second short across the transmission line, wherein a location of the second device and the second short is farther from the first end of the transmission line than the location of the first device and the first short; configuring the first device to inject a second pulse signal into the transmission line at the location of the first device along the length of the transmission line; measuring a peak voltage of a second difference signal at the first end of the transmission line, the second difference signal resulting from the second pulse signal and a reflection of the second pulse signal by the second short; and determining the location of the first device along the length of the transmission line based on a first distance estimate using the peak voltage of the first difference signal and a second distance estimate using the peak voltage of the second difference signal.

In another illustrative example, an apparatus for wireless communication is provided. The apparatus includes at least one memory and at least one processor coupled to the at least one memory and configured to: configure a first device of a plurality of devices attached to a transmission line to create a first short across the transmission line at a location of the first device along a length of the transmission line, wherein each device of the plurality of devices is attached to a respective location along the length of the transmission line between a first end and a second end of the transmission line; inject a first pulse signal into the first end of the transmission line; measure a peak voltage of a first difference signal at the first end of the transmission line, the first difference signal resulting from a reflection of the first pulse signal by the first short; configure a second device attached to the transmission line to create a second short across the transmission line, wherein a location of the second device and the second short is farther from the first end of the transmission line than the location of the first device and the first short; configure the first device to inject a second pulse signal into the transmission line at the location of the first device along the length of the transmission line; measure a peak voltage of a second difference signal at the first end of the transmission line, the second difference signal resulting from the second pulse signal and a reflection of the second pulse signal by the second short; and determine the location of the first device along the length of the transmission line based on a first distance estimate using the peak voltage of the first difference signal and a second distance estimate using the peak voltage of the second difference signal.

In another illustrative example, a non-transitory computer-readable storage medium comprising instructions stored thereon which, when executed by at least one processor, causes the at least one processor to: configure a first device of a plurality of devices attached to a transmission line to create a first short across the transmission line at a location of the first device along a length of the transmission line, wherein each device of the plurality of devices is attached to a respective location along the length of the transmission line between a first end and a second end of the transmission line; inject a first pulse signal into the first end of the transmission line; measure a peak voltage of a first difference signal at the first end of the transmission line, the first difference signal resulting from a reflection of the first pulse signal by the first short; configure a second device attached to the transmission line to create a second short across the transmission line, wherein a location of the second device and the second short is farther from the first end of the transmission line than the location of the first device and the first short; configure the first device to inject a second pulse signal into the transmission line at the location of the first device along the length of the transmission line; measure a peak voltage of a second difference signal at the first end of the transmission line, the second difference signal resulting from the second pulse signal and a reflection of the second pulse signal by the second short; and determine the location of the first device along the length of the transmission line based on a first distance estimate using the peak voltage of the first difference signal and a second distance estimate using the peak voltage of the second difference signal.

In another illustrative example, an apparatus is provided for wireless communication. The apparatus includes: means for configuring a first device of a plurality of devices attached to a transmission line to create a first short across the transmission line at a location of the first device along a length of the transmission line, wherein each device of the plurality of devices is attached to a respective location along the length of the transmission line between a first end and a second end of the transmission line; means for injecting a first pulse signal into the first end of the transmission line; means for measuring a peak voltage of a first difference signal at the first end of the transmission line, the first difference signal resulting from a reflection of the first pulse signal by the first short; means for configuring a second device attached to the transmission line to create a second short across the transmission line, wherein a location of the second device and the second short is farther from the first end of the transmission line than the location of the first device and the first short; means for configuring the first device to inject a second pulse signal into the transmission line at the location of the first device along the length of the transmission line; means for measuring a peak voltage of a second difference signal at the first end of the transmission line, the second difference signal resulting from the second pulse signal and a reflection of the second pulse signal by the second short; and means for determining the location of the first device along the length of the transmission line based on a first distance estimate using the peak voltage of the first difference signal and a second distance estimate using the peak voltage of the second difference signal.

Aspects generally include a method, apparatus, system, computer program product, non-transitory computer-readable medium, user device, user equipment, wireless communication device, and/or processing system as substantially described with reference to and as illustrated by the drawings and specification.

Some aspects include a device having a processor configured to perform one or more operations of any of the methods summarized above. Further aspects include processing devices for use in a device configured with processor-executable instructions to perform operations of any of the methods summarized above. Further aspects include a non-transitory processor-readable storage medium having stored thereon processor-executable instructions configured to cause a processor of a device to perform operations of any of the methods summarized above. Further aspects include a device having means for performing functions of any of the methods summarized above.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims. The foregoing, together with other features and aspects, will become more apparent upon referring to the following specification, claims, and accompanying drawings.

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

BRIEF DESCRIPTION OF THE DRAWINGS

The accompanying drawings are presented to aid in the description of various aspects of the disclosure and are provided solely for illustration of the aspects and not limitation thereof. So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

FIG. 4A is a diagram illustrating an example system including a two-conductor wire with a pulse and peak circuit and one or more controllable short devices coupled thereto, in accordance with some examples;

FIG. 4B is a diagram illustrating an example of a first short in the system of FIG. 4A, implemented using a first controllable short device, in accordance with some examples;

FIG. 4C is a diagram illustrating an example of a second short in the system of FIG. 4A, implemented using a second controllable short device, in accordance with some examples;

DETAILED DESCRIPTION

Figure 1:
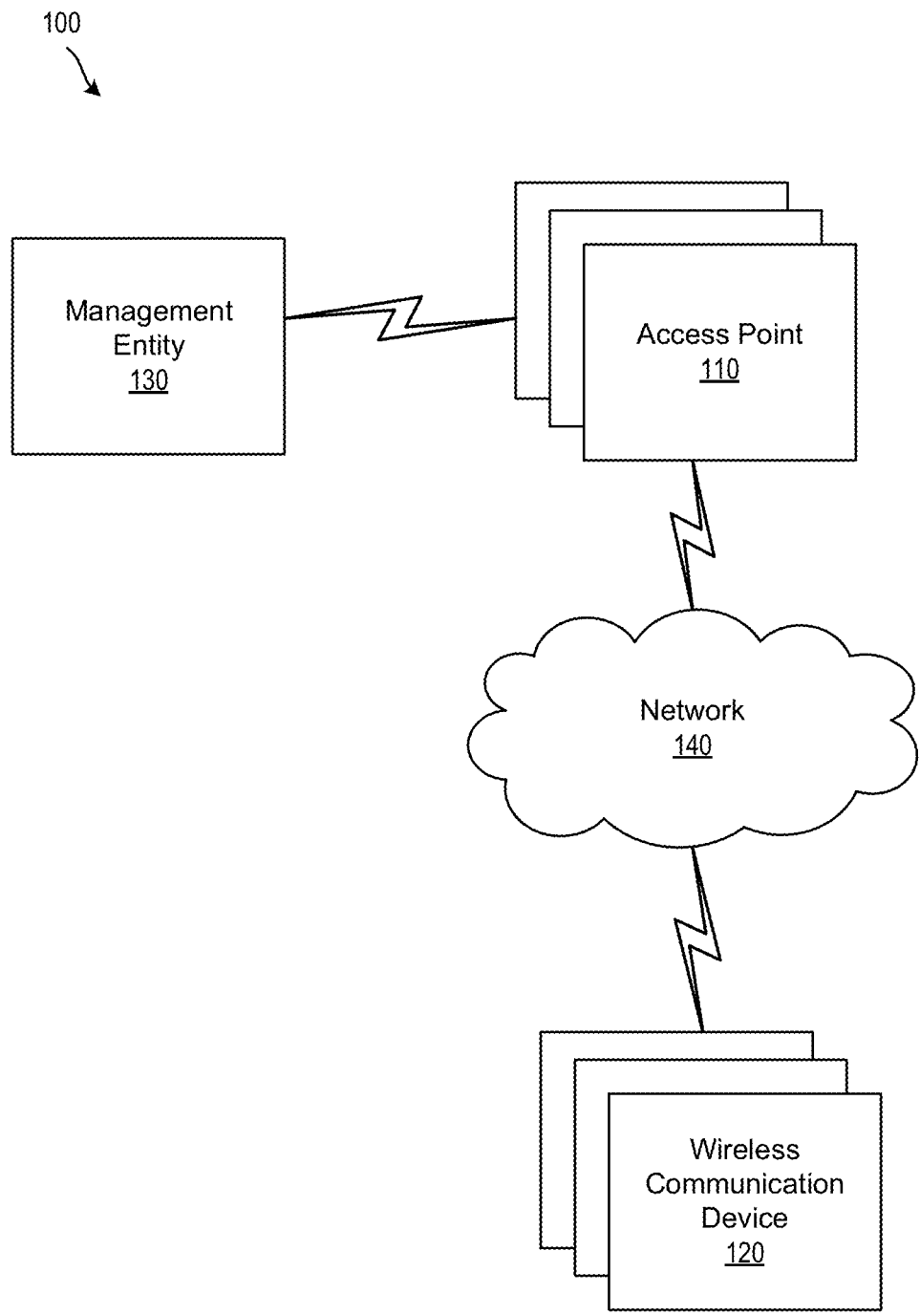
FIG. 1 is a diagram illustrating an example environment in which systems and/or methods described herein may be implemented, in accordance with some examples.

Certain aspects of this disclosure are provided below for illustration purposes. Alternate aspects may be devised without departing from the scope of the disclosure. Additionally, well-known elements of the disclosure will not be described in detail or will be omitted so as not to obscure the relevant details of the disclosure. Some of the aspects described herein may be applied independently and some of them may be applied in combination as would be apparent to those of skill in the art. In the following description, for the purposes of explanation, specific details are set forth in order to provide a thorough understanding of aspects of the application. However, it will be apparent that various aspects may be practiced without these specific details. The figures and description are not intended to be restrictive.

The ensuing description provides example aspects, and is not intended to limit the scope, applicability, or configuration of the disclosure. Rather, the ensuing description of the example aspects will provide those skilled in the art with an enabling description for implementing an example aspect. It should be understood that various changes may be made in the function and arrangement of elements without departing from the scope of the application as set forth in the appended claims.

A system may include one or more wireless communication devices that are controlled by a network entity. For example, a system including multiple peripheral devices (e.g., an electronic shelf label (ESL) system) may include one or more wireless communication devices (e.g., peripheral devices, such as ESLs) that are controlled by a network entity, such as a management entity (ME), via at least one network device, such as an access point (AP). In one or more examples, to facilitate control by the ME, each peripheral device (e.g., ESL) may have a wireless connection (e.g., a BLUETOOTH® Low Energy (BLE) connection or other connection) to AP that is communicatively connected to the ME (e.g., via the Internet, such as wirelessly, via an Ethernet connection, etc.). In some cases, an AP and an ME can be combined in a single device (e.g., a single device can perform the functionalities associated with an AP and the functionalities associated with an ME). In some cases, commands from the ME may be wirelessly transmitted to the peripheral devices (e.g., ESLs) by the AP. Responses or information from the peripheral devices may also be received by the AP and provided by the AP to the ME. Each AP may have an associated channel map. A channel map is a listing of frequency channels to be utilized or, conversely, not to be utilized (e.g., in the context of modification of frequency hopping sequences) by an AP for communication, such as with the ESLs or other peripheral devices. While examples are described herein using ESLs as illustrative examples of wireless communication devices, a management entity as an example of a network entity, and access points as examples of network devices, the systems and techniques described herein are applicable to any type of system or network.

In some examples, ESL systems can be deployed to support and manage ESL devices in stores (e.g., supermarkets) and other retail spaces. In some examples, ESL systems may be deployed to support and manage ESL devices in warehouses (e.g., distribution centers) and other industrial spaces. For instance, in a store, ESLs may be provided as electronic labels that are affixed to store shelves to identify the items and the price of the items located on the store shelf above the label. ESLs may be each implemented with a display (e.g., a liquid crystal display (LCD), an electronic paper (e-paper) display, etc.). The ESL may digitally display the name of the item, a product identification number for the item, such as a stock keeping unit (SKU) number, and a price for the item. The ESL may additionally display a barcode for the item, a quick response (QR) code for the item, and/or an image (e.g., a picture) of the item. In some examples, each ESL may include a display and a radio or wireless transceiver for communicating with one or more APs and/or MEs included in the ESL system. For example, during operation of the ESL system, the information displayed on the ESLs may be updated periodically by using periodic advertisements (PAS).

In some examples, multiple electronic labels can be associated with or affixed to a same rail. For example, a rail can be the portion of the shelf that faces forward (e.g., faces an aisle, or individual in the aisle, adjacent to the shelf) and upon which the electronic labels are affixed. In some examples, each shelf can include its own rail. In other examples, one rail may be affixed to or associated with multiple adjacent shelves. The electronic labels associated with or affixed to a given rail may be provided as ESLs (e.g., each ESL including its own display and/or including its own wireless transceiver). In some cases, the electronic labels associated with or affixed to a given rail may each include a display, without including a wireless transceiver. For example, the electronic labels can comprise a plurality of rail displays (e.g., electronic ink (e-ink) displays) that do not include a dedicated wireless transceiver. In some aspects, a rail to which one or more ESLs are affixed may be referred to as an ESL rail. An ESL rail can include one or more conductors configured to provide power and/or data connectivity to the affixed ESLs. For instance, an ESL rail can include one or more parallel conductors oriented along the longitudinal length of the ESL rail. In some examples, an ESL rail can be implemented as a two-conductor (e.g., two-wire) rail, a three-conductor (e.g., three-wire) rail, etc.

In some cases, an ESL system can additionally include one or more controllers. For instance, a controller can be implemented using an ESL device (e.g., including a wireless transceiver). An ESL device used as a controller may include a display or may not include a display. For example, each given rail can be associated with a respective controller. Each ESL associated with or affixed to the given rail can be communicatively coupled to the respective controller. A controller can include a radio or other wireless transceiver for communicating with APs and/or MEs that are associated with the same ESL system. A controller can further include a serial interface that provides a wired connection to each ESL of the plurality of ESLs associated with the controller. For example, the ESLs associated with a rail may communicate with APs and/or MEs of the ESL system via the respective controller (e.g., the ESLs can communicate with the controller via the wired serial interface, and the controller can then wirelessly communicate with an AP or ME). In some examples, a battery capacity that may be associated with a controller can be larger than a battery capacity that may be associated with a standalone ESL. For example, a controller may have a battery capacity of 3500 mAh and a standalone ESL may have a battery capacity of 350 mAh.

In some cases, one or more ESLs may be physically moved to a new location. For example, one or more ESLs may be moved from one location in a retail store (e.g., a particular shelf or a storage area) to a different location in the retail store, to a different retail store location, etc. In some examples, store shelves (e.g., with a plurality of ESLs attached thereto) may be attached to a gondola that allows the moving or repositioning the shelves and the products provided on the shelves. In another example, an ESL that is provided as a tracker (e.g., such as a printed active BLE label) may by physically moved during transportation of a pallet (e.g., to which the tracker is attached) from a distribution center to a retail store location.

ESLs that are affixed to a rail may be physically moved and repositioned to a new (e.g., different) position along the same rail. For instance, during a reorganization of products on a store's shelves (e.g., products to which the ESLs correspond), the ESLs may be moved and/or repositioned along a rail attached to the shelf. In another example, ESLs that are affixed to a first rail may be physically moved to a different rail, such as a rail located at a higher or lower shelf position, a left or right shelf position, a shelf of a different aisle, etc., relative to the ESL's original rail and shelf position.

There is a need for systems and techniques that can be used to determine or estimate the location of devices attached to a transmission line. For instance, there is a need for systems and techniques that can be used to determine or estimate the location of ESLs attached to a transmission line such as a multi-conductor rail (e.g., two-conductor, three-conductor, etc.). In some techniques, wireless positioning estimation may be performed based on one or more wireless radio frequency (RF) transmissions to and/or from the multiple ESLs or other devices coupled to the multi-conductor rail. Wireless position estimation can be relatively inaccurate at the scale and granularity at which ESLs may be positioned on a rail or store shelf. For instance, wireless position estimation techniques with an accuracy of ±0.5 m may struggle to accurately determine the locations of multiple ESLs that are attached to a rail or shelf with an inter-ESL separation (e.g., distance between consecutive or adjacent ESLs along the rail) of less than 1 m. In some examples, ESLs associated with a display of products on a store shelf may commonly be affixed at separation distances significantly shorter than 1 m.

There is a need for systems and techniques that can be used to determine or estimate the location of ESLs or other devices coupled to a multi-conductor transmission line, based on using one or more signals propagated along the multi-conductor transmission line. For instance, there is a need for systems and techniques that can be used to determine or estimate the location of ESLs or other devices along a conductive rail, without using wireless signaling and/or other wireless transmissions or RF signals.

Systems, apparatuses, processes (also referred to as methods), and computer-readable media (collectively referred to as "systems and techniques") are described herein that can be used to perform distance estimation for a plurality of devices on a transmission line using controllable shorts. For instance, the systems and techniques can be used to perform distance estimation for a plurality of ESLs coupled to a multi-conductor transmission line (e.g., rail), where the distance estimation can be performed with the plurality of ESLs simultaneously coupled to the rail. In one illustrative example, each ESL of the plurality of ESLs can be coupled to the rail at a different location along the length of the rail. Each ESL of the plurality of ESLs can include a respective pulse circuit, where the respective pulse circuit is configured to inject (e.g., transmit, propagate, etc.) a pulse signal into the multi-conductor rail. The location of the pulse circuit included in the ESL and the location of the ESL can be the same. The location along the length of the multi-conductor rail where an ESL injects a pulse signal (e.g., using the pulse circuit included in or associated with the ESL) can be determined and used as an estimate of the location of the ESL itself along the length of the rail.

For instance, a respective ESL of the plurality of ESLs coupled to the rail can inject a respective pulse signal into the transmission line from the location of the ESL. The pulse signal can propagate in a first direction along the rail (e.g., left of the ESL/pulse signal injection location) and a second direction along the rail (e.g., right of the ESL/pulse signal injection location).

A peak detection circuit can be coupled to a first end of the rail. For instance, the peak detection circuit can be coupled to each conductor of the multi-conductor rail, at a left distal end of the rail (e.g., an example where the rail and the plurality of ESLs coupled thereto are to the right of the peak detection circuit). The peak detection circuit can receive a first signal corresponding to the injected pulse signal propagating to the left of the ESL.

In some aspects, a controllable short (e.g., a controllable short circuit and/or controllable short circuit device) can be provided at the second end of the rail. For instance, continuing in the example above, the controllable short can be provided at the right distal end of the rail, such that the plurality of ESLs are to the left of the controllable short. The controllable short can be controlled to create or remove a short circuit between a first and second conductor of the rail, at the second end of the rail. In one illustrative example, the systems and techniques can perform distance estimation to the location of the plurality of ESLs based on configuring the controllable short to cause a short circuit across the first and second conductors of the rail when each respective ESL injects its corresponding pulse signal into the rail.

For example, with the controllable short configured to cause the short circuit across the multi-conductor rail, the portion of the injected pulse signal that propagates to the right of the ESL is reflected off of the short (e.g., at the second end of the rail), back towards the peak detection circuit at the first end of the rail). For each ESL of the plurality of ESLs, an estimated distance from the peak detection circuit to the location where the pulse signal was injected into the rail can be determined, based on a first detected signal corresponding to the directly propagating portion of the injected pulse signal (e.g., the portion propagating to the left of the ESL, towards the peak detection circuit) and based on a second detected signal corresponding to a reflected portion of the injected pulse signal (e.g., the portion of the injected pulse signal that first propagates to the right of the ESL, is reflected off the controllable short at the second end of the rail, and then propagates leftward along the length of the rail between the controllable short and the peak detection circuit).

Each ESL of the plurality of ESLs can be configured to implement a respective controllable short circuit across the multi-conductor rail. The controllable short circuit can be configured to cause a short circuit between at least two conductors of the rail, at the location where the respective ESL is attached to the rail. For instance, an ESL with a controllable short circuit can cause a short circuit by closing a switch or otherwise establishing a conductive path between a first conductor and second conductor of the rail, where the switch or conductive path of the short circuit is provided at the location of the ESL along the rail.

In one illustrative example, an ESL can include a pulse circuit configured to inject a pulse signal into the rail at the location of the ESL, and can include a controllable short circuit configured to short across the multiple conductors of the rail at the location of the ESL.

In some examples, a location of the ESL along the rail can be determined based on a first distance measurement and a second distance measurement. For instance, the first distance measurement can be determined based on transmitting a pulse signal into the multi-rail conductor from a first distal end (e.g., which may be the same end of the rail where the peak detection circuit is located and coupled thereto). In some aspects, the pulse signal can be transmitted by a pulse circuit included in, associated with, and/or implemented by the peak detection circuit. The first distance measurement for each respective ESL of the plurality of ESLs can be determined based on configuring the respective ESL to controllably short across the multi-conductor rail prior to or when the pulse signal is transmitted. The pulse is reflected back to the peak detection circuit, based on the pulse reflecting off of the short caused by the controllable short of the ESL. The peak detection circuit (e.g., which may be included in and/or combined with the pulse circuit) can be used to determine a peak height corresponding to the superposition of the forward and reflected pulse shapes. For example, the signal measured by the peak detection circuit can correspond to a superposition of the forward-propagating forward pulse and the backward-propagating reflected pulse, where the forward pulse and the reflected pulse partially cancel each other in the superposition. The partial cancellation between the forward and reflected pulses can correspond to the distance (e.g., separation) between the controlled short ESL and the pulse and peak detection circuit, and the resultant peak height (e.g., detected by the peak detection circuit) can be used to determine an estimate of this separation distance. For example, the peak height of the superposition signal received at the peak detection circuit can be used to determine the first distance measurement for the respective ESL, as an estimated distance from the pulse and peak detection circuit to the location of the controllable short caused by the respective ESL.

The second distance measurement for the same respective ESL can be determined based on using the respective ESL to inject a pulse signal into the rail, at the location of the respective ESL (e.g., using a pulse circuit included in the respective ESL, as noted previously above). The pulse signal injected by the respective ESL propagates in a first direction from the respective ESL to the peak detection circuit, without reflecting. The pulse signal injected by the respective ESL also propagates in a second direction from the respective ESL to the controllable short at the opposite end of the rail, where the signal is reflected back to the peak detection circuit. The second distance measurement for the ESL can be determined based on the directly propagating portion and the reflected portion of the pulse signal injected by the respective ESL into the rail, at the location of the respective ESL along the rail.

In some aspects, the first distance measurement technique (e.g., configuring each respective ESL to controllably short across the multi-conductor rail to reflect a pulse signal injected by the peak detection circuit) can be associated with a higher measurement accuracy for shorter distances. For instance, in examples where the peak detection and pulse circuit(s) is provided at the left end of the rail, the first distance measurement technique can be associated with higher measurement accuracy for ESLs located closer to the left end of the rail.

The second distance measurement technique (e.g., configuring each respective ESL to inject a pulse signal into the rail while the second end of the rail is controllably shorted) can be associated with a higher measurement accuracy for ESLs located closer to the controllable short at the opposite end of the rail from the peak detection and pulse circuit(s). For instance, in examples where the peak detection and pulse circuit(s) is provided at the left end of the rail and the controllable short is provided at the right end of the rail, the second distance measurement technique can be associated with higher measurement accuracy for ESLs located closer to the right end of the rail.

In some aspects, the systems and techniques can be configured to determine a respective location for each ESL of a plurality of ESLs coupled to the rail, based on determining a first distance estimate using the respective ESL to controllably short across the multi-conductor rail and determining a second distance estimate using the respective ESL to inject a pulse signal while the rail is controllably shorted at its second end. In one illustrative example, the respective location of the ESL can be determined based on a combination of the first distance estimate and the second distance estimate. For instance, the respective location of the ESL can be determined based on a weighted combination of the first distance estimate and the second distance estimate, where the first distance estimate is given a greater weighting for locations closer to the peak detection and pulse circuit(s) at a first end of the rail, and the second distance estimate is given a greater weighting for locations closer to the controllable short at the second end of the rail (e.g., where the second end of the rail is opposite from the first end of the rail, and where the plurality of ESLs are coupled to the rail between the first and second ends of the rail).

Additional aspects of the present disclosure are described with reference to the figures.

FIG. 1 is a diagram of an example environment 100 in which systems and/or methods described herein may be implemented. As shown in FIG. 1, the environment 100 may include at least one access point (AP) 110, at least one wireless communication device 120, a management entity (ME) 130, and a network 140. Devices of the environment 100 may interconnect via wired connections, wireless connections, or a combination of wired and wireless connections.

The access point 110 may include one or more devices capable receiving, generating, storing, processing, providing, and/or routing information associated with access point synchronization and/or handover, as described elsewhere herein. The access point 110 may include a communication device and/or a computing device. The access point 110 may be configured to transmit beacons (e.g., BLE beacons), as well as to scan and locate other devices (e.g., other devices communicating using BLE protocols).

The wireless communication device 120 may include one or more devices capable of receiving, generating, storing, processing, and/or providing information associated with access point synchronization and/or handover, as described elsewhere herein. The wireless communication device 120 may include a communication device and/or a computing device. In some aspects, the wireless communication device 120 may be, may include, or may be included in an electronic shelf label (ESL).

The management entity 130 includes one or more devices capable of receiving, generating, storing, processing, providing, and/or routing information associated with access point synchronization and/or handover, as described elsewhere herein. The management entity 130 may include a communication device and/or a computing device. For example, the management entity 130 may include a server, such as an application server, a client server, a web server, a database server, a host server, a proxy server, a virtual server (e.g., executing on computing hardware), or a server in a cloud computing system. In some aspects, the management entity 130 includes computing hardware used in a cloud computing environment. The management entity 130 may provide control of a system (e.g., an ESL system) that includes the access point(s) 110, the wireless communication device(s) 120, and/or the device(s) 130. The access point(s) 110 may be communicatively connected to the management entity 130 via a network (not shown), such as the Internet.

The network 140 may include one or more wireless networks. For example, the network 140 may include a personal area network (e.g., a Bluetooth network). The network 140 enables communication among the devices of environment 100.

The number and arrangement of devices and networks shown in FIG. 1 are provided as an example. In practice, there may be additional devices and/or networks, fewer devices and/or networks, different devices and/or networks, or differently arranged devices and/or networks than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
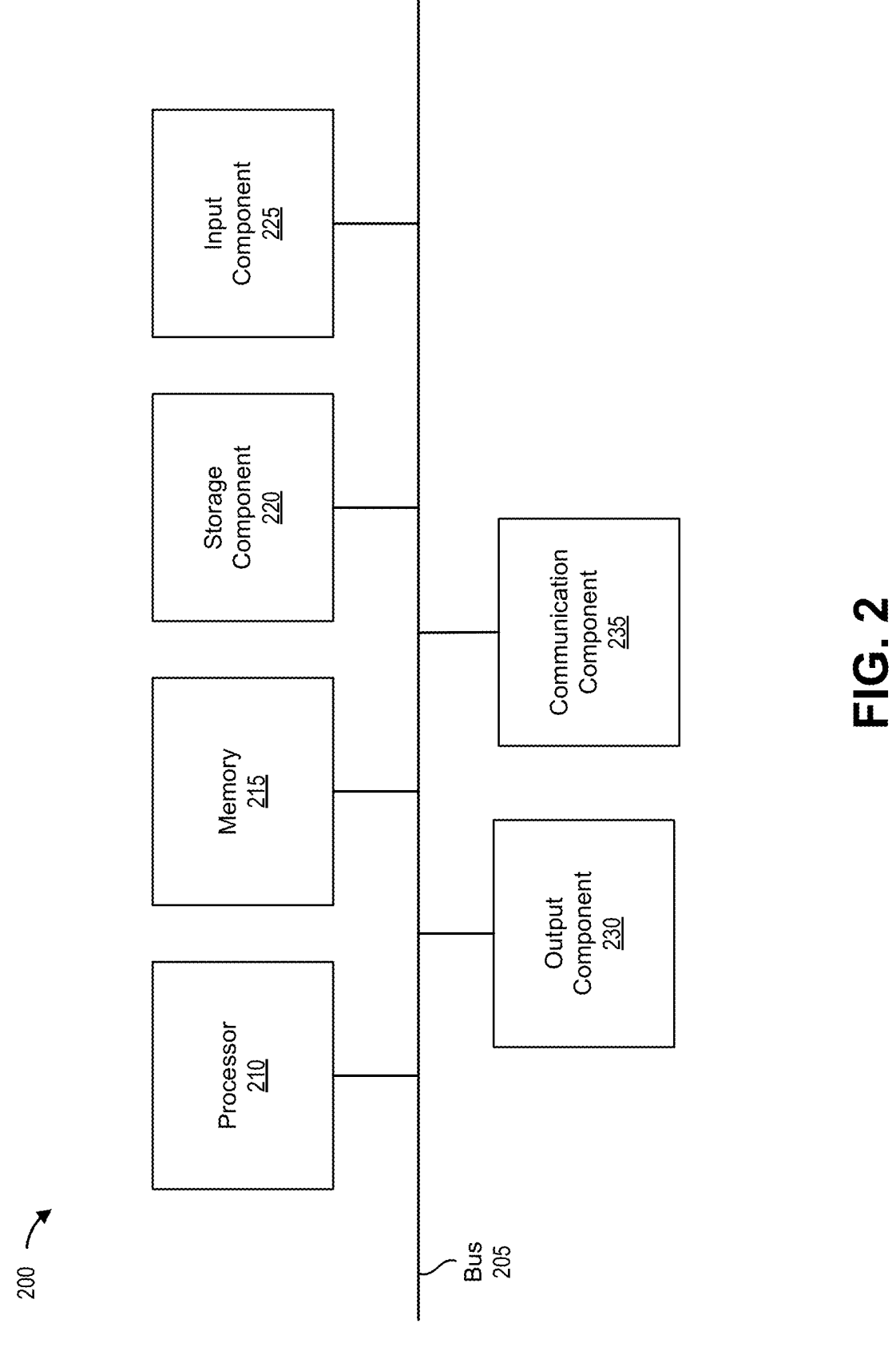
FIG. 2 is a diagram illustrating example components of a device, in accordance with some examples.

FIG. 2 is a diagram illustrating example components of a device 200, in accordance with the present disclosure. Device 200 may correspond to access point 110, wireless communication device 120, and/or management entity 130. In some aspects, access point 110, wireless communication device 120, and/or management entity 130 may include one or more devices 200 and/or one or more components of device 200. As shown in FIG. 2, device 200 may include a bus 205, a processor 210, a memory 215, a storage component 220, an input component 225, an output component 230, and/or a communication component 235.

Bus 205 may include a component that permits communication among the components of device 200. Processor 210 may be implemented in hardware, firmware, or a combination of hardware and software. Processor 210 may be a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some aspects, processor 210 may include one or more processors capable of being programmed to perform a function. Memory 215 may include a random access memory (RAM), a read only memory (ROM), and/or another type of dynamic or static storage device (e.g., a flash memory, a magnetic memory, and/or an optical memory) that stores information and/or instructions for use by processor 210.

Storage component 220 can store information and/or software related to the operation and use of device 200. For example, storage component 220 may include a hard disk (e.g., a magnetic disk, an optical disk, a magneto-optic disk, and/or a solid state disk), a compact disc (CD), a digital versatile disc (DVD), a floppy disk, a cartridge, a magnetic tape, and/or another type of non-transitory computer-readable medium, along with a corresponding drive.

Input component 225 may include a component that permits device 200 to receive information, such as via user input (e.g., a touch screen display, a keyboard, a keypad, a mouse, a button, a switch, and/or a microphone). Additionally, or alternatively, input component 225 may include a component for determining a position or a location of device 200 (e.g., a global positioning system (GPS) component or a global navigation satellite system (GNSS) component) and/or a sensor for sensing information (e.g., an accelerometer, a gyroscope, an actuator, or another type of position or environment sensor). Output component 230 can include a component that provides output information from device 200 (e.g., a display, a speaker, a haptic feedback component, and/or an audio or visual indicator).

Communication component 235 may include one or more transceiver-like components (e.g., a transceiver and/or a separate receiver and transmitter) that enables device 200 to communicate with other devices, such as via a wired connection, a wireless connection, or a combination of wired and wireless connections. Communication component 235 may permit device 200 to receive information from another device and/or provide information to another device. For example, communication component 235 may include an Ethernet interface, an optical interface, a coaxial interface, an infrared interface, a radio frequency interface, a universal serial bus (USB) interface, a wireless local area interface (e.g., a Wi-Fi interface or a BLE interface), and/or a cellular network interface.

Communication component 235 may include one or more antennas for receiving wireless radio frequency (RF) signals transmitted from one or more other devices, cloud networks, and/or the like. The antenna may be a single antenna or an antenna array (e.g., antenna phased array) that can facilitate simultaneous transmit and receive functionality. The antenna may be an omnidirectional antenna such that signals can be received from and transmitted in all directions. The wireless signals may be transmitted via a wireless network. The wireless network may be any wireless network, such as a cellular or telecommunications network (e.g., 3G, 4G, 5G, etc.), wireless local area network (e.g., a WiFi network), a Bluetooth™ network, and/or other network.

The one or more transceiver-like components (e.g., a wireless transceiver) of the communication component 235 may include an RF front end including one or more components, such as an amplifier, a mixer (also referred to as a signal multiplier) for signal down conversion, a frequency synthesizer (also referred to as an oscillator) that provides signals to the mixer, a baseband filter, an analog-to-digital converter (ADC), one or more power amplifiers, among other components. The RF front-end can generally handle selection and conversion of the wireless signals into a baseband or intermediate frequency and can convert the RF signals to the digital domain.

In some cases, a CODEC may be implemented (e.g., by the processor 210) to encode and/or decode data transmitted and/or received using the one or more wireless transceivers. In some cases, encryption-decryption may be implemented (e.g., by the processor 210) to encrypt and/or decrypt data (e.g., according to the Advanced Encryption Standard (AES) and/or Data Encryption Standard (DES) standard) transmitted and/or received by the one or more wireless transceivers.

In some aspects, device 200 may represent an ESL. The ESL may include a battery in addition to the aforementioned components. In some aspects, the output component 230 of the ESL may be an electronic paper (e-paper) display or a liquid crystal display (LCD).

Device 200 may perform one or more processes described herein. Device 200 may perform these processes based on processor 210 executing software instructions stored by a non-transitory computer-readable medium, such as memory 215 and/or storage component 220. A computer-readable medium is defined herein as a non-transitory memory device. A memory device includes memory space within a single physical storage device or memory space spread across multiple physical storage devices.

Software instructions may be read into memory 215 and/or storage component 220 from another computer-readable medium or from another device via communication component 235. When executed, software instructions stored in memory 215 and/or storage component 220 may cause processor 210 to perform one or more processes described herein. Additionally, or alternatively, hardwired circuitry may be used in place of or in combination with software instructions to perform one or more processes described herein. Thus, aspects described herein are not limited to any specific combination of hardware circuitry and software.

The number and arrangement of components shown in FIG. 2 are provided as an example. In practice, device 200 may include additional components, fewer components, different components, or differently arranged components than those shown in FIG. 2. Additionally, or alternatively, a set of components (e.g., one or more components) of device 200 may perform one or more functions described as being performed by another set of components of device 200.

Figure 3A:
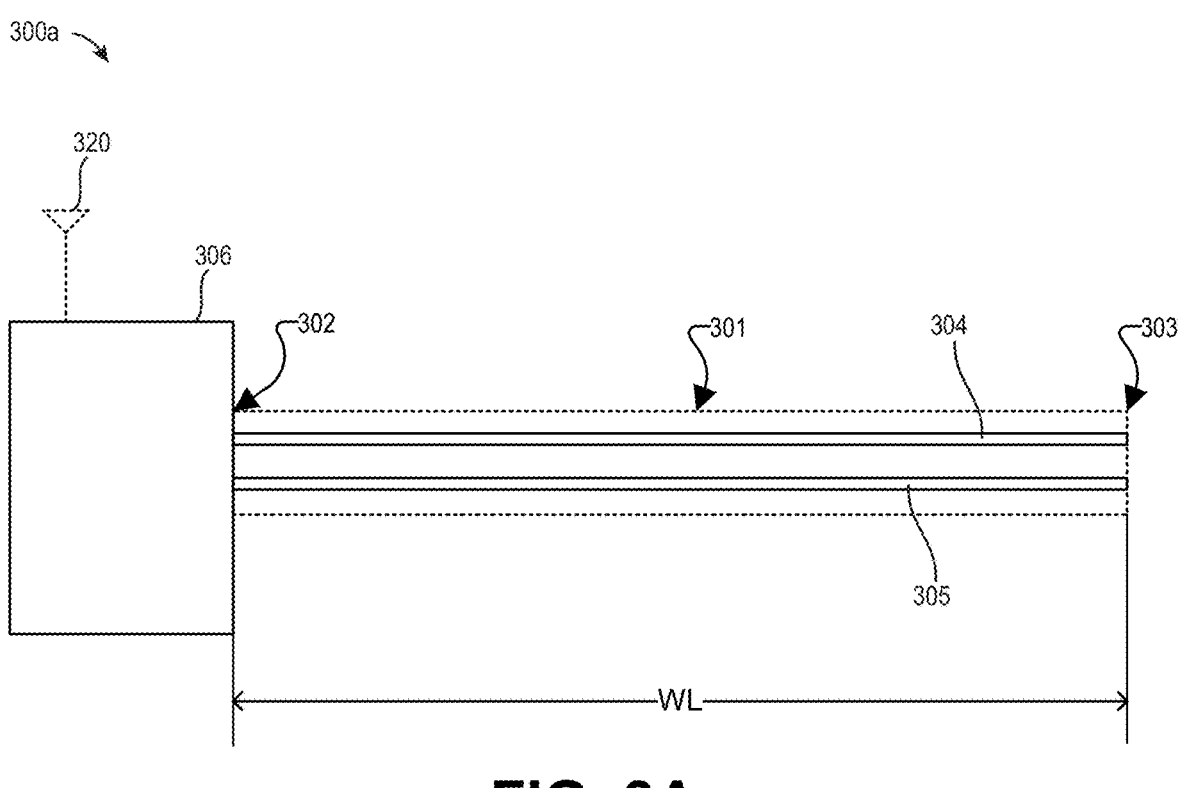
FIG. 3A is a diagram illustrating an example system including a two-conductor wire, in accordance with some examples.

FIG. 3A is a system block diagram illustrating an example system 300a including a multi-conductor transmission line 301. In some cases, the multi-conductor transmission line 301 can be implemented as a two-conductor wire, a three-conductor wire, etc. The multi-conductor transmission line 301 may also be referred to herein as a "rail," "transmission line," "line," and/or "wire." The system may include a device 306 connected to the two-conductor wire 301. In some aspects, the device 306 can be configured to determine a distance to a short in the multi-conductor transmission line 301. In some aspects, the device 306 can be implemented as a peak detection circuit (e.g., also referred to herein as a "peak circuit" and/or a "peak detect circuit").

The multi-conductor rail 301 may include two or more conductors, such as a first conductor 304 and a second conductor 305. While illustrated as including two conductors, first conductor 304 and second conductor 305, the multi-conductor rail 301 may include additional conductors. The multi-conductor rail 301 may have a known length, such as a wire length "WL" running from a first end 302 of the multi-conductor rail 301 to a second end 303 of the multi-conductor rail 301. The first conductor 304 and the second conductor 305 may be same length conductors, such as conductors running the known length (e.g., WL) of the multi-conductor rail 301. The multi-conductor rail 301 may be an embedded structure in another device, such as a collection of two or more conductors within a device. In some examples, the multi-conductor rail 301 may be its own structure, such as two or more conductors supported in a jacket structure, and/or a rail apparatus associated with an ESL system, etc.

The device 306 may be permanently connected to the multi-conductor rail 301 or the device 306 may be removably connected to the multi-conductor rail 301. Whether permanently or removably connected to the multi-conductor rail 301, the device 306 may be electrically connected to each of the first conductor 304 and the second conductor 305. In some examples, the device 306 may include an antenna 320 configured to send and/or receive electromagnetic radiation to support sending and/or receiving wireless signals by the device 306. The antenna 320 may support communications using various radio access technologies (RATs), such as Bluetooth Low Energy (BLE), Wi-Fi, etc. The device 306 may be any type device connected to the multi-conductor rail 301, such as a fault detector connected to the multi-conductor rail 301 to detect faults in the multi-conductor rail 301, a test device connected to the multi-conductor rail 301 to test an attribute of the multi-conductor rail 301, a control device connected to the multi-conductor rail 301 to control devices connected to the multi-conductor rail 301, a communication device connected to the multi-conductor rail 301 to communicate with another device via the multi-conductor rail 301, etc.

Figure 3B:
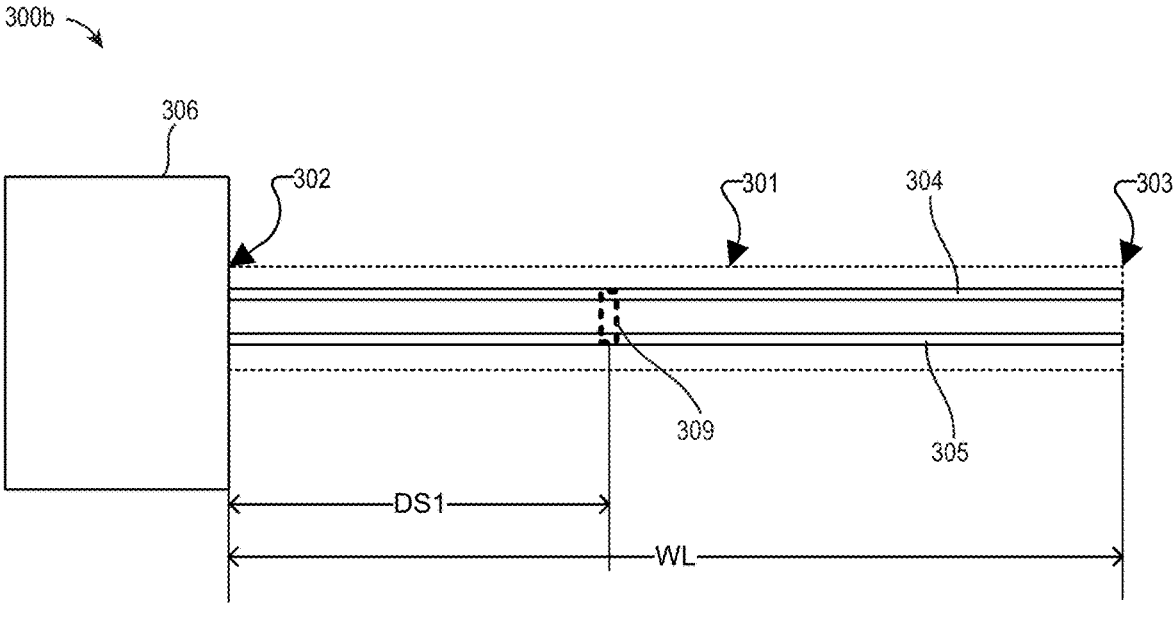
FIG. 3B is a diagram illustrating an example short circuit in the system of FIG. 3A, in accordance with some examples.

FIG. 3B illustrates an example short circuit 309 in the system 300a of FIG. 3A. As used herein, the terms "short circuit" and "short" may be used interchangeably. With reference to the example system 300a of FIG. 3A and/or the example system 300b of FIG. 3B, the short 309 may an electrical connection across the first conductor 304 and the second conductor 305 that enables current to travel between the first conductor 304 and the second conductor 305. In some cases, the short 309 may be unintentionally created, such as by damage to the multi-conductor rail 301, a manufacturing defect in the multi-conductor rail 301, etc. In some aspects, the short 309 may be intentionally created, for instance based on configuring an on-rail device (e.g., an ESL, a controllable short circuit device, etc.) to physically and/or mechanically close or create a conductive connection between the first conductor 304 and the second conductor 305. In some cases, the short 309 can be configured or created based on an on-rail device inserting or moving into place a connective wire between two or more conductors of the multi-conductor rail 301 (e.g., between the first conductor 304 and the second conductor 305, etc.). In some examples, the short 309 may be a distance, DS1, from the first end 302 of the multi-conductor rail 301. In some cases, the device 306 may be configured to determine the distance, DS1, from the first end 302 to the short 309 in the multi-conductor rail 301.

FIG. 4A is a diagram illustrating an example system 400a including a multi-conductor rail with a pulse and peak circuit and one or more controllable short devices coupled thereto, in accordance with some examples. FIG. 4B is a diagram 400b illustrating an example of a first short in the system 400a of FIG. 4A, implemented using a first controllable short device. FIG. 4C is a diagram 400c illustrating an example of a second short in the system 400a of FIG. 4A, implemented using a second controllable short device.

In some aspects, the example system 400a includes the device 306 and the multi-conductor rail 301 (e.g., with first conductor 304 and second conductor 305) of FIGS. 3A-3B. In one illustrative example, the system 400a further includes two controllable devices 402 coupled to the multi-conductor rail 301.

In one illustrative example, each controllable device 402 can be an Electronic Shelf Label (ESL) device. For instance, the controllable device 402 can be an ESL the same as or similar to the ESL 120 of FIG. 1, the ESL 200 of FIG. 2, etc. In some cases, the controllable device 402 of FIGS. 4A-C can be included in and/or implemented by an ESL that is the same as or similar to the ESL 120 of FIG. 1. In some examples, the device 306 (e.g., a peak detection circuit) of FIGS. 4A-C can be included in and/or implemented by a management entity (ME) that is the same as or similar to the ME 130 of FIG. 1. In some aspects, the device 306 (e.g., a peak detection circuit) of FIGS. 4A-C can be included in and/or implemented by a rail controller associated with the multi-conductor rail 301 and/or the controllable devices 402 (e.g., ESLs). In some aspects, the multi-conductor rail 301 can be an ESL rail, shelf, etc., associated with a plurality of ESLs.

With reference to FIGS. 3A-4A, the controllable devices (e.g., ESLs) 402 may be connected to the rail 301 at various locations. The controllable devices 402 may be configured to create a short between two conductors of the rail 301, such as between the first conductor 304 and the second conductor 305. The controllable devices 402 may be implemented using any type of device configured to be connected to the rail 301. For example, the controllable devices 402 may be ESLs and/or Internet-of-Things (IoT) devices connected to (e.g., coupled to, attached to, etc.) the rail 301. In some examples, the controllable devices 402 may be networked devices connected to the rail 301. While two controllable devices 402 are illustrated in FIG. 4A, any number of controllable devices 402 may be present on the rail wire 301, such as one controllable device 402, two controllable devices 402, three controllable devices 402, more than three controllable devices 402, etc.

The controllable devices (e.g., ESLs) 402 may be permanently connected to the rail 301 or the controllable devices 402 may be removably connected to the rail 301. Whether permanently or removably connected to the rail 301, the controllable devices 402 may be electrically connected to each of the first conductor 304 and the second conductor 305. In some examples, a controllable device 402 may include an antenna 422 configured to send and/or receive electromagnetic radiation to support sending and/or receiving wireless signals by the controllable device 402. The antenna 422 may support communications using various RATs, such as Bluetooth Low Energy (BLE), Wi-Fi, etc.

In some examples, the controllable devices (e.g., ESLs) 402 may communicate with the device 306 via wireless transmissions 415 between the device 306 and one or more of the controllable devices 402. Support for wireless communications by the controllable devices 402 may be optional as the controllable devices 402 may be controlled in other manners, such as via wired connections to the controllable devices 402. Additionally, and/or alternatively, the controllable devices 402 and the device 306 may support communications with one another via their respective connections to the rail 301. Support for communications via the rail 301 between the controllable devices 402 and the device 306 may be optional as the controllable devices 402 may not communicate via the rail 301 with in all scenarios. In some configurations, the device 306 may control the controllable devices 402 to cause one or more of the controllable devices 402 to create a short between the first conductor 304 and the second conductor 305 and/or to cause one or more of the controllable devices 402 to remove a short between the first conductor 304 and the second conductor 305. For instance, the controllable devices 402 can be implemented as ESLs that include a controllable short (e.g., ESLs that are configurable to create and/or remove a short circuit connection between the first conductor 304 and the second conductor 305 of the multi-conductor rail 301).

FIG. 4B is a system block diagram 400b illustrating an example of a first short 309 created by a first one of the controllable devices (e.g., ESLs with controllable short) 402. With reference to FIGS. 3A-4B, the short 309 may be created by the controllable device 402 closest to the first end 302 of the rail 301 (e.g., the left-most of the two controllable devices 402 shown in FIGS. 4A-C).

For example, the device 306 (e.g., rail controller, peak detection circuit, etc.) may signal to the controllable device 402 closest to the first end 302 to create the short circuit 309 between the first conductor 304 and the second conductor 305. In some examples, the device 306 may signal the controllable device 402 closest to the second end 303 to not create a short. The control signal to cause the controllable device 402 to create the short 309 may be sent via wireless transmissions 415 and/or via the multi-conductor rail 301. The distance to the short 309 created by the controllable device 402 closest to the first end 302 may be a distance, DSA, from the device 306. In some aspects, the device 306 may be configured to determine a distance to the controllable device 402 closest to the first end 302 based on the distance to the short 309 in the rail 301. For instance, a distance measurement circuit (e.g., based on and/or including a peak detection circuit, etc.) of the device 306 may be configured to determine the distance, DSA, from the first end 302 to the short 309 in the multi-conductor rail 301 as the distance to the controllable device 402 closest to the first end 302.

FIG. 4C is a system block diagram 400c illustrating an example of a second short 309 created by a second of the controllable devices 402 (e.g., ESLs configured to controllably cause and/or remove a controllable short across the first conductor 304 and the second conductor 305 of the multi-conductor rail 301). With reference to FIGS. 3A-4C, the short 309 may be created by the controllable device 402 closest to the second end 303. For example, the device 306 may signal to the controllable device 402 closest to the second end 303 to create the short 309. Similarly, the device 306 may signal the controllable device 402 closest to the first end 302 to not create a short. The control signal to cause the controllable device 402 to create the short 309 may be sent via wireless transmissions 415 and/or via the rail 301. The distance to the short 309 created by the controllable device 402 closest to the second end 303 may be a distance, DSB, from the device 306. The distance DSB may be different than the distance DSA. The controllable devices 402 may be uniquely identified by assigned identifiers, and the device 306 may uniquely signal each of the respective controllable devices 402 using that controllable device's 402 identifier such that only one of the controllable devices 402 creates a short 309 at any given time. In some aspects, the device 306 may be configured to determine a distance to the controllable device 402 closest to the second end 303 based on the distance to the short 309 in the rail 301. As an example, a distance measurement circuit of the device 306 may be configured to determine the distance, DSB, from the first end 302 to the short 309 in the rail 301 as the distance to the controllable device 402 closest to the second end 303.

Figure 4D:
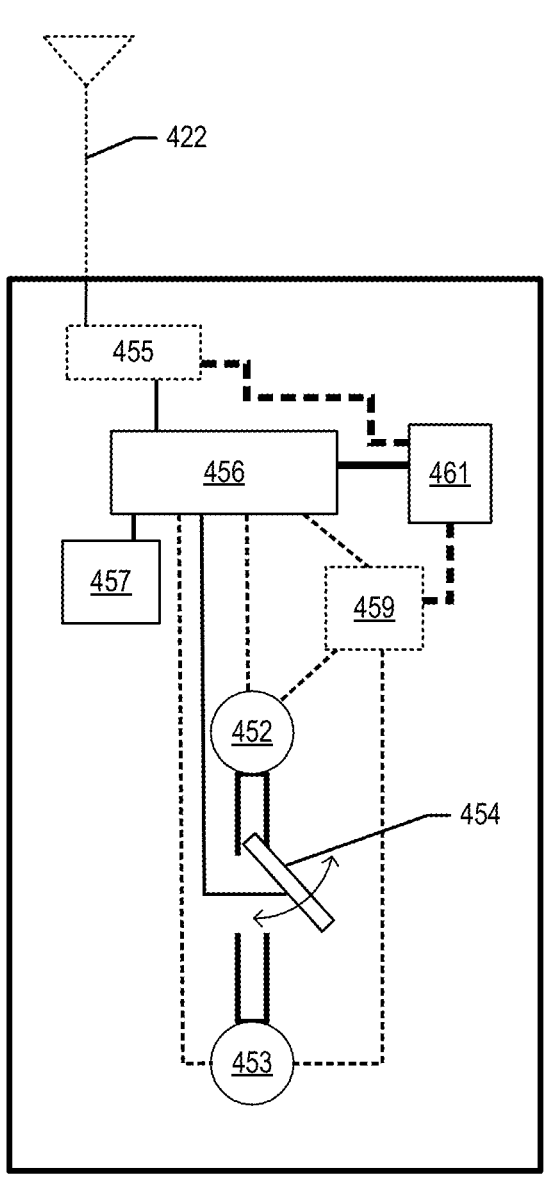
FIG. 4D is a block diagram of an example controllable short device, in accordance with some examples.

FIG. 4D is a block diagram of an example controllable short device 400*d*, in accordance with some examples. In some aspects, the controllable short device 400*d* of FIG. 4D can be the same as or similar to the controllable device(s) 402 of FIGS. 4A-4C. In one illustrative example, the controllable short device 400*d* can be an ESL device, the same as or similar to one or more of the ESLs 120 of FIG. 1, the ESL 200 of FIG. 2, etc.

The controllable short circuit device 402 may also be referred to herein as a controllable short ESL and/or a controllable short circuit ESL. The controllable short ESL 402 can be configured to be connected to a multi-conductor rail, such as the multi-conductor rail 301. With reference to FIGS. 3A-4D, the controllable short device 402 may include a controllable switch 454 disposed between two connectors 452 and 453. For example, the controllable switch 454 may be any type of switch, configured to be at least moved between two positions, such as opened and closed. For example, the controllable switch 454 may be implemented using one or more FETs, dedicated radio frequency (RF) switch integrated circuits (ICs), thyristors, BJTs, logic gates, etc. In some examples, the controllable switch 454 may be connected to a processor 456 that may be connected to a memory 457. The memory 457 may be a volatile or non-volatile memory. The processor 456 may be a dedicated processor, an SOC, or an SIP, etc. The processor 456 and/or controllable switch 454 may be powered by a power source 461 of the controllable device 402, such as a battery, connection to an external power source, combination of battery and external power source, etc.

The connectors 452 and 453 may each be configured to connect to one of the conductors of a multi-conductor rail, such as to the first conductor 304 or second conductor 305 of the multi-conductor rail 301. The connectors 452 and 453 may electrically connect the controllable device (e.g., controllable short circuit ESL) 402 to the conductors 304, 305. The controllable switch 454 may be configured such that when the controllable switch 454 is closed, a short between the connectors 452 and 453, and thereby a short between the two conductors 304 and 305, may be created (e.g., the short 309 may be created). The controllable switch 454 may be configured such that when the controllable switch 454 is opened, the connectors 452 and 453 may not be electrically connected with one another, and thereby a short between the connectors 452 and 453 may not occur. The controllable switch 454 may be connected to the processor 456 and may open and close responsive to signals from the processor 456.

The controllable device 402 may optionally include a wireless transceiver 455 connected to the optional antenna 422 and the processor 456. The antenna 422, wireless transceiver 455, and/or processor 456 may support communications using various RATs, such as one or more of Bluetooth, Wi-Fi, etc. The antenna 422 and wireless transceiver 455 may be optional as the controllable device 402 may not communicate wireless with other devices in all scenarios. Additionally, and/or alternatively, the processor 456 and connectors 452 and 453 may optionally support communications with other devices via the connection to the rail 301. For example, an optional wired transceiver 459 may be connected to the processor 456 and support communications via the rail 301. Support for communications via the controllable device 402 may be optional as the controllable device 402 may not communicate via the rail 301 with other devices in all scenarios. When present in the controllable device 402, the wireless transceiver 455 and/or wired transceiver 459 may be optionally connected to, and powered by, the power source 461.

Figure 5:
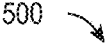
FIG. 5 is a diagram illustrating an example of pulse interference in the presence of a short circuit, in accordance with some examples.
Figure 5:
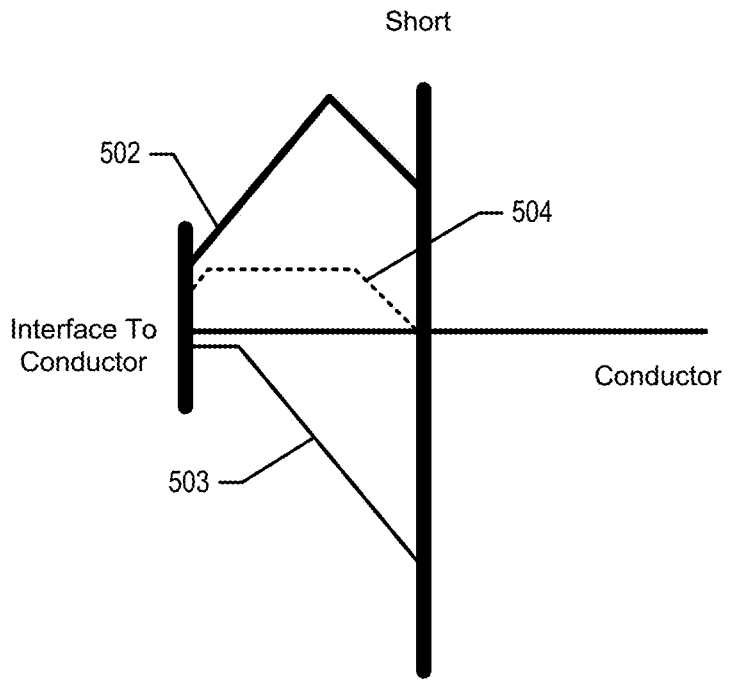

FIG. 5 is a diagram illustrating an example of pulse interference 500 in the presence of a short circuit, such as the short circuit 309 of FIGS. 3A-4D. In some aspects, the example pulse interference 500 of FIG. 5 corresponds to a snapshot of an instant in time depicting the spatial voltages of an injected pulse 502, a reflected pulse 503, and a combined pulse 504 (e.g., a spatial arrangement of a pulse in a conductor). The injected pulse 502 may be injected into a conductor, such as the conductor 304 or 305 of the multi-conductor rail 301 of FIGS. 3A-4D. The injected pulse 502 may have a pulse width and may travel toward the short, such as the short 309. The pulse width (e.g., pulse duration) of the injected pulse 502 may be selected such that the whole injected pulse 502 fills the multi-conductor rail 301 in space when no short is present. When a short 309 is present, the injected pulse 502 may be reflected from the short, such as short 309, with a reflected pulse 503 returned down the conductor (e.g., 304, 305). For example, the injected pulse 502 may be inverted when reflected from the short 309 and be returned down the conductor (e.g., 304, 305) as a reflected pulse 503. The reflected pulse 503 and the injected pulse 502 may sum together to form a combined pulse 504 that has a peak voltage lower than the peak voltage of the injected pulse 502.

Figure 6:
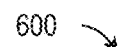
FIG. 6 is a plot of example peak voltages of pulses on a transmission line (e.g., conductor or wire) resulting from pulse interference, in accordance with some examples.
Figure 6:
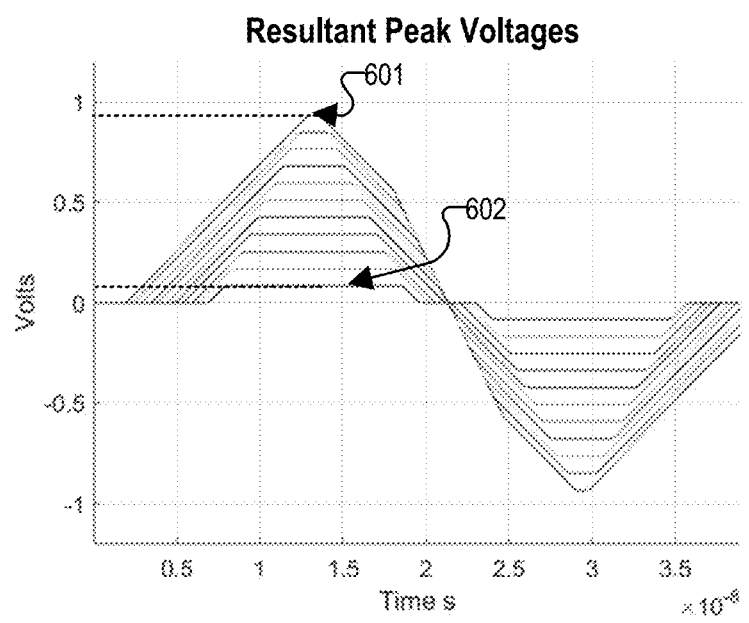

FIG. 6 is an example graph 600 of example peak voltages of pulses on a transmission line (e.g., conductor or wire) resulting from pulse interference at a short in a conductor or transmission line (e.g., such as the multi-conductor rail 301 of FIGS. 3A-5), in accordance with some examples. The plot 600 illustrates different combined pulses with different pulse peak voltages that may result from an injected pulse, such as pulse 502 of FIG. 5, being reflected from a short, such as short 309 of FIGS. 3A-4C. The different pulse peak voltages may be proportional to the distance to the short, such as short 309. The distance to the short may be measured from the location (e.g., along the same rail 301) of a pulse circuit used to inject, transmit, or otherwise couple the pulse 502 into the rail 301. For example, when the device 306 is used to transmit the pulse 502 into the multi-conductor rail, the distance to the short can be determined as the distance between the device 306 and the controllable short circuit device (e.g., controllable short ESL) 402, based on the controllable short circuit device 402 causing the short 309 at the location of the controllable short circuit device 402 along the length of the rail 301.

In one illustrative example, a closer short (e.g., shorter distance between the device 306 and the controllable short circuit device 402 associated with the short 309 in the multi-conductor rail 301) may result in a lower peak voltage 602 than a peak voltage resulting from a farther short 601. Peak voltage values may be correlated with distances in a memory structure (e.g., array, look-up table, etc.) in a memory and the resulting peak voltage may be matched to a stored peak voltage to determine the distance to the short as the distance correlated with the matching peak voltage value in the memory.

As noted previously above, the systems and techniques described herein can be used to perform distance estimation for a plurality of devices on a transmission line, using one or more controllable short circuits across a multi-conductor transmission line and one or more pulse signals injected into (e.g., transmitted on) the transmission line. In one illustrative example, the plurality of devices on the transmission line can be a plurality of ESLs coupled to a rail.

Figures 7A, 7B:
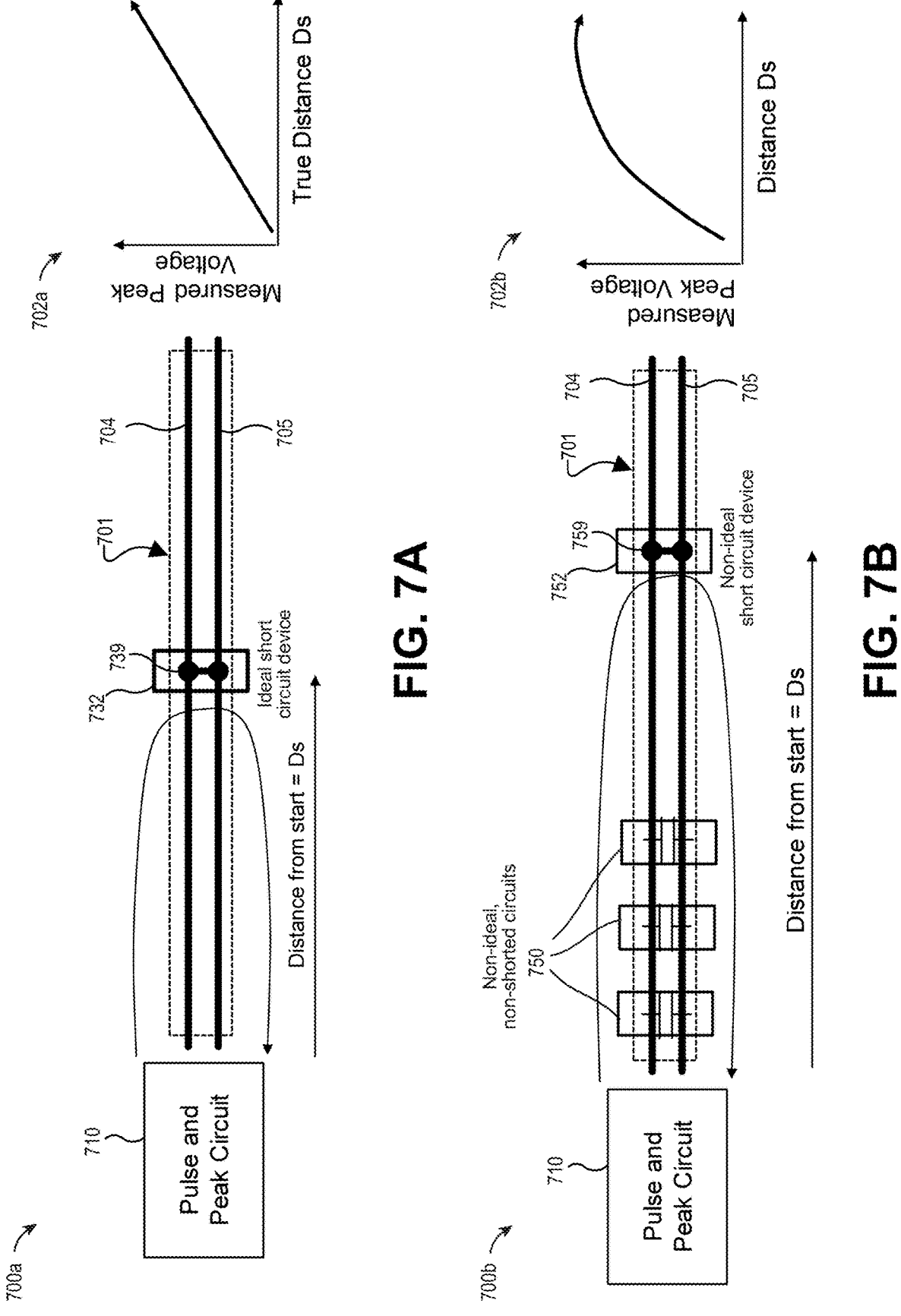
FIG. 7A is a diagram illustrating an example of a system including a multi-conductor transmission line with a pulse and peak circuit configured to determine a distance to an ideal short circuit device coupled thereto, in accordance with some examples.
FIG. 7B is a diagram illustrating an example of a system including a multi-conductor transmission line with a pulse and peak circuit configured to determine a distance to a non-ideal short circuit device coupled thereto, in accordance with some examples.

FIG. 7A is a diagram illustrating an example of a system 700a that can be used to implement distance estimation to locate a plurality of devices on (e.g., along the length of) a rail or other multi-conductor transmission line. FIG. 7B is a diagram illustrating an example of a system 700b that can be the same as or similar to the system 700a of FIG. 7B, with the addition of a plurality of non-shorted devices 750 coupled to the multi-conductor transmission line (e.g., where the non-shorted devices 750 may be provided as controllable short circuit devices that are configured to not cause a short circuit between the first conductor 704 and the second conductor 705 of the rail 701).

The system 700a of FIG. 7A and/or the system 700b of FIG. 7B can include a multi-conductor transmission line 701 (e.g., also referred to as a "rail" and/or "multi-conductor rail" 701) and a pulse and peak circuit 710 configured to determine a distance to controllable short circuit device coupled thereto, in accordance with some examples. In the example of FIG. 7A, a controllable short circuit device 732 can be controlled to cause or not cause a short circuit 739 between the first conductor 704 and the second conductor 705 of the rail 701. In the example of FIG. 7B, a controllable short circuit device 752 can be controlled to cause or not cause a short circuit 759 between the first conductor 704 and the second conductor 705 of the rail 701. In some aspects, the controllable short circuit device 732 of FIG. 7A can be provided as an ideal mechanical short circuit device 732, among various other types and/or configurations of controllable short circuit devices, relays, etc. that may be used for the controllable short 732. In some aspects, the controllable short circuit device 752 of FIG. 7B can be provided a non-ideal solid-state relay (SSR) controllable short circuit device, among various other types and/or configurations of controllable short circuit devices, relays, etc., that may be used for the controllable short 752.

A controllable short circuit can be implemented using various short circuit devices and/or techniques. For example, the systems and techniques described herein can implement a short circuit (e.g., including the controllable short circuit device 732 of FIG. 7A and/or the controllable short circuit device 752 of FIG. 7B, etc.) using one or more of a mechanical relay, a reed relay, a solid-state relay (SSR), a metal-oxide-semiconductor field-effect transistor (MOSFET), etc., among various other short circuit devices, relays, etc.

In some examples, the short circuit 732 and/or the short circuit 759 can be the same as or similar to the short 309 of FIGS. 3B-4C and/or a short circuit implemented by the switch 454 of the device 400d of FIG. 4D. In some cases, the short circuit 732 and/or the short circuit 759 can be the same as or similar to the short 500 of FIG. 5. In some cases, the ideal mechanical short circuit device 732 of FIG. 7A and/or the non-ideal SSR short circuit device 752 of FIG. 7B can be the same as or similar to the controllable short circuit device 402 of FIGS. 4A-4C and/or the controllable short circuit device 400d of FIG. 4D. In one illustrative example, the controllable short circuit device 732 of FIG. 7A and/or the controllable short circuit device 752 of FIG. 7B can be implemented as ESLs.

The multi-conductor rail 701 of FIGS. 7A-7B can be the same as or similar to the multi-conductor rail 301 of FIGS. 3A-4C. The first conductor 704 and the second conductor 705 of FIGS. 7A-7B can be the same as or similar to the first conductor 304 and the second conductor 305, respectively, of FIGS. 3A-4C.

In some cases, the pulse and peak circuit 710 can include and/or combine a pulse circuit and a peak detection circuit. For instance, the pulse circuit of the pulse and peak circuit 710 can be used to generate and transmit (e.g., inject) one or more configured pulse signals onto the rail 701. The peak detection circuit of the pulse and peak circuit 710 can be used to perform peak detection based on one or more return signals detected on the rail 701 in response to the injected pulse signal(s). In some aspects, the pulse and peak circuit 710 can be the same as or similar to the device 302 of FIGS. 3A-4C.

In some aspects, location estimation can be performed for one or more devices attached to the multi-conductor transmission line 701 based on using a combination of injected pulses (e.g., injected pulse signals from the pulse and peak circuit 710) and controlled short circuits (e.g., the controllable shorts 739 and/or 759). For instance, FIG. 7A may correspond to an example of location estimation for a single device 732 coupled to the rail 701 at a location that is a distance Ds from the pulse and peak circuit 710 (e.g., a distance Ds from the short circuit 739 to the interface or coupling between the pulse and peak circuit 710 and the conductors 704, 705 of the rail 701).

For example, the distance Ds can be estimated to locate the device 732 along the rail 701 based on using the pulse and peak circuit 710 to inject a pulse signal at one end of the rail 701. In some examples, the pulse and peak circuit 710 can inject a saw-tooth pulse at a first end of the rail 701 (e.g., the left end of rail 701, in the example of FIGS. 7A and/or 7B). The saw-tooth pulse can be generated to have a configured duration suitable for performing distance estimation of the distance Ds to the device 732. The saw-tooth pulse can be injected into the conductors 704, 705 of the rail 701 and may propagate towards the device 732 and controlled short circuit 739 (e.g., may propagate left-to-right). At the device 732, the propagating saw-tooth pulse is reflected (e.g., negatively) off of a single short within the device 732 (e.g., the controlled short circuit 739), and the reflected pulse propagates in the opposite direction (e.g., right-to-left) back towards the pulse and peak circuit 710.

The reflected pulse propagating on the rail 701 creates a difference signal that can be detected and/or measured by the pulse and peak circuit 710. For instance, a peak detection circuit included in or implemented by the pulse and peak circuit 710 can be used to determine a peak magnitude of the difference signal, where the peak magnitude is proportional to the distance Ds to the controlled short 739 within the device 732 coupled to the rail 701. Based on measuring the peak voltage height of the difference signal, the distance Ds from the start of the rail (e.g., the coupling or interface between rail 701 and pulse and peak circuit 710) to the short 739 can be estimated. For instance, the graph 702a of FIG. 7A illustrates an example of the proportional relationship between the measured peak voltage of the difference signal (e.g., shown on the vertical axis) and the underlying distance Ds to the short 739 (e.g., shown on the horizontal axis). For a single controlled short device 732 coupled to the rail 701, the distance estimation based on the measured peak voltage of the difference signal measured at the pulse and peak circuit 710 can be associated with a high theoretical accuracy at all locations (e.g., distances) along the length of the rail 701.

In some aspects, the controlled short circuit device 732 may be an ESL or ESL display, and the transmission line 701 can be a 2-wire or 3-wire rail configured to hold the ESL display. In some examples, the transmission line or rail 701 can have a length of 1.2 m, among various other lengths.

In examples where a plurality of ESLs or ESL displays are coupled to the rail 701, the technique described above may be associated with reduced accuracy in estimating the distance to each respective one of the plurality of ESLs. For instance, FIG. 7B illustrates an example where a plurality of controlled short devices are coupled to the rail 701. To estimate the distance Ds to a particular controlled short device 752 of the plurality of controlled short devices, the particular controlled short device 752 for which the distance Ds is being estimated can be controlled to cause a short 759 across the rail 701. The remaining controlled short devices 750 of the plurality of controlled short devices can be controlled to not cause a short across the rail 701.

In some aspects, the controlled short devices 750, 752 can be implemented as and/or included in respective ESLs or ESL displays. The controlled short 759 can be associated with a mechanical and/or MEMS relay that is movable between a short and non-short position or configuration. In the short configuration, the relay can create a conductive path between the first conductor 704 and the second conductor 705. In the non-short configuration, the relay does not create a conductive path between the first conductor 704 and the second conductor 705.

In some aspects, the controlled short devices 750, 752 can be implemented as solid state relay (SSR) devices, among various other types and/or configurations of controllable short circuits (e.g., such as mechanical relays, reed relays, MOSFETs, etc.). The following examples make reference to an example where the controlled short devices 750, 752 are implemented as SSR devices, although it is noted the following references to an "SSR" or "SSRs" can include various other types and/or implementations of controllable short circuits as noted above. In some cases, each SSR may contribute a respective capacitance that accumulates along the length of the rail 701. For instance, FIG. 7B illustrates three SSRs 750 that are controlled to the non-short circuit position, but each contribute a respective capacitance that accumulates along rail 701. The accumulated capacitance from the plurality of SSRs or other controlled short devices (e.g., mechanical relays, reed relays, MOSFETs, etc.) or ESLs 750 can be associated with an increased low-pass filtering effect when performing the respective distance estimation for the distance Ds to each controlled short device 750, 759. The increased low-pass filtering effect can be associated with a progressively reduced accuracy for the distance estimation Ds performed for controlled short devices 750, 759 that are progressively farther down the length of the rail 701. For example, the accuracy of the distance estimation Ds for the controlled short device 752 can be lower than the accuracy of the distance estimation Ds for each respective one of the SSRs 750. The diminishing accuracy with increased capacitance accumulation and distance from the pulse and peak circuit 710 is illustrated in the graph 702b of FIG. 7B. The measured peak voltage (e.g., of the difference signal) vs. distance Ds has a high gradient at the start, corresponding to lower values of the true distance Ds along the rail 701. The gradient of the graph 702b decreases for larger values of the true distance Ds, corresponding to the decreased accuracy of distance estimation for larger distances Ds that are farther away on the rail 701 from the pulse and peak circuit 710.

The smaller gradient for larger values of the true distance Ds corresponds to reduced or lower accuracy based on a lesser error tolerance in the mapping between the measured peak voltage to an estimated distance Ds value. For instance, in the high gradient portion of the graph 702b (e.g., for smaller values of Ds), a change of ±0.1 V in the measured peak voltage of the difference signal may correspond to a change of ±0.01 m in the estimated distance Ds. In the low gradient portion of the graph 702b (e.g., for larger values of Ds), the same change of ±0.1V in the measured peak voltage of the difference signal may correspond to a change of ±0.5 m in the estimated Ds. In some aspects, the reduced gradient of the graph 702 of peak voltage vs. distance Ds can correspond to reduced accuracy distance estimations, based at least in part on the measurement accuracy of the peak detection circuit being mapped to a larger range of distance uncertainty in the smaller gradient portion of the graph 702. Additionally, in some cases, the pulse circuit implemented by or included in the pulse and peak circuit 710 may not be perfectly linear, which can be associated with further degradation at the end of the rail 701 (e.g., at larger distances Ds).

The systems and techniques described herein can be used to accurately determine the location of (e.g., determine accurate distance estimates for) multiple controlled short devices (e.g., ESLs or ESL displays, etc.) coupled along the length of the multi-conductor rail 701. The systems and techniques can additionally be used to determine an order (e.g., relative order) of the respective controlled short devices of the plurality of controlled short devices along the rail 701.

Figures 8A, 8B:
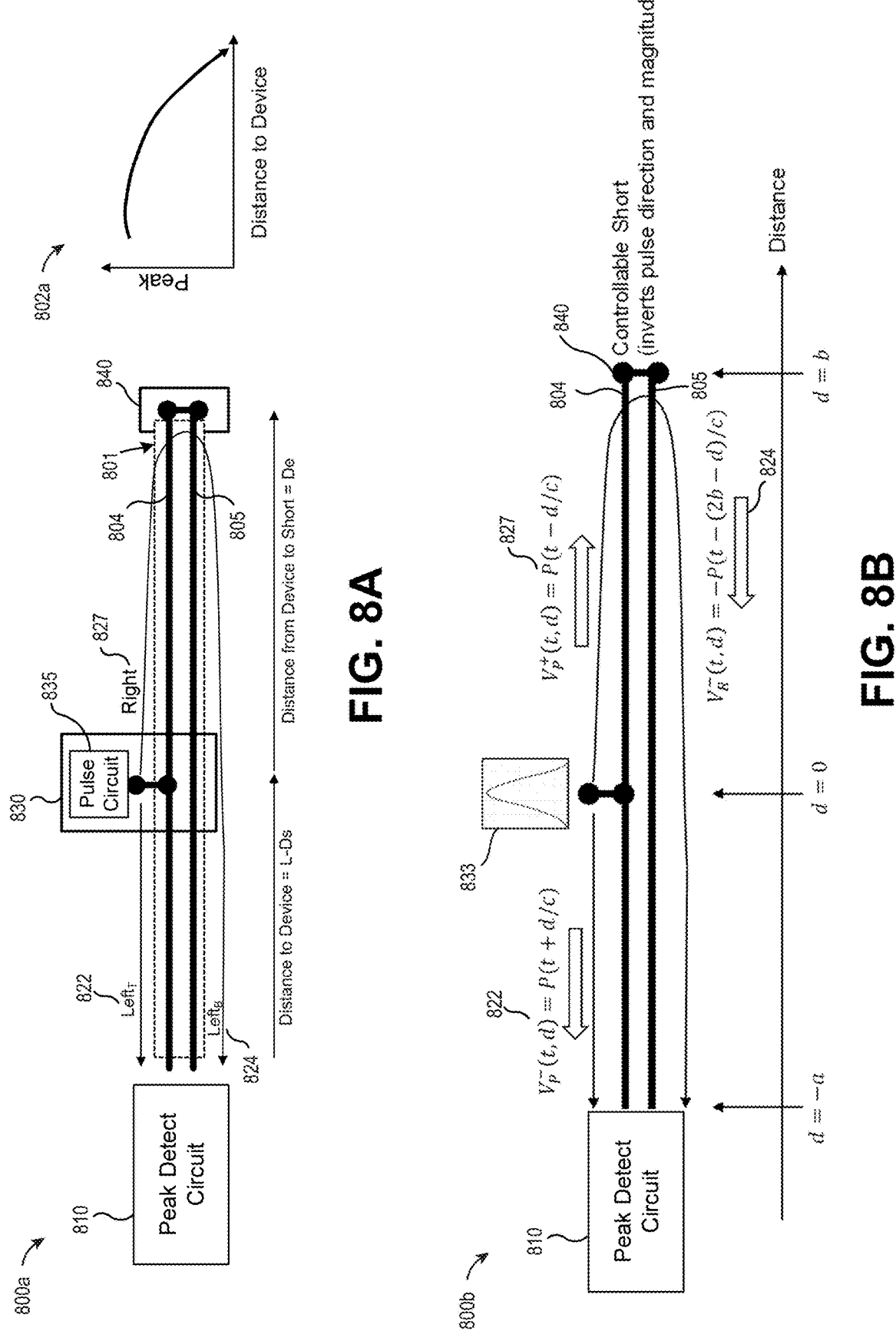
FIG. 8A is a diagram illustrating an example of a system including a pulse circuit device and a controllable short circuit device coupled to a multi-conductor transmission line, in accordance with some examples.
FIG. 8B is a diagram illustrating an example of first and second pulse signals received at a peak detection circuit coupled to the multi-conductor transmission line of FIG. 8A in response to a pulse transmitted by the pulse circuit device, in accordance with some examples.

FIG. 8A is a diagram illustrating an example of a system 800a including a peak detection circuit 810 configured to perform distance estimation using a pulse circuit device 830 and a controllable short circuit 840 coupled to a multi-conductor transmission line 840, in accordance with some examples. FIG. 8B is a diagram illustrating an example of first and second pulse signals received at the peak detection circuit 810 coupled to the multi-conductor transmission line of FIG. 8A in response to a pulse 833 transmitted by the pulse circuit device 830, in accordance with some examples.

In some aspects, the peak detection circuit of FIGS. 8A and 8B can be the same as or similar to the pulse and peak circuit 710 of FIGS. 7A and 7B. A multi-conductor transmission line (e.g., a rail) 801 can be the same as or similar to the rail 701 of FIGS. 7A-7B. The rail 801 can include a first conductor 804 and a second conductor 805 that are the same as or similar to the first conductor 704 and the second conductor 705, respectively, of FIGS. 7A-7B.

In some aspects, a controlled short circuit 840 can be the same as or similar to the controlled short circuit 739 and/or 759 of FIGS. 7A and 7B, respectively. In one illustrative example, the device 830 can be an ESL that includes a pulse circuit 835 configured to generate and transmit (e.g., inject) a configured pulse signal onto the rail 801.

The peak detection circuit 810 can be coupled to a first end of the rail 801. For instance, the peak detection circuit 810 can be coupled to each conductor 804, 805 of the multi-conductor rail 801, at a left distal end of the rail 801 (e.g., corresponding to an example where the rail 801 and the one or more ESLs 830 coupled thereto are to the right of the peak detection circuit 810).

The ESL 830 can be configured to inject a pulse signal into the rail 801, using the pulse circuit 835 included in the ESL 830. In one illustrative example, the ESL 830 can inject the pulse signal 833 into the first conductor 804 of the rail 801, where the pulse signal 833 is injected at the location of the ESL 830 and/or pulse circuit 835 along the length of the rail 801.

A first portion of the injected pulse signal 833 can propagate in a right-to-left direction, from the ESL 830 to the peak detection circuit 810, along the first conductor 804 of the rail 801. This first portion of the injected pulse signal 833 can be received and measured by the peak detection circuit 810 as the pulse signal component "Left" 822 shown in FIG. 8A and FIG. 8B. The top left pulse signal component 822 can propagate a distance L-Ds (e.g., where L represents the total length of the rail 801 and the conductors 804, 805) between the location along the rail 801 where the pulse signal 833 is injected and the end of the rail 801 attached to the peak detection circuit 810.

A second portion of the injected pulse signal 83 can propagate in a left-to-right direction, from the ESL 830 to controllable short 840, along the first conductor 804 of the rail 801. This second portion of the injected pulse signal 833 can be represented as the pulse signal component "Right" 827 shown in FIG. 8A and FIG. 8B. In some aspects, the controllable short 840 (e.g., a controllable short circuit and/or controllable short circuit device) can be provided at the second end of the rail 801. For instance, continuing in the example above, the controllable short 840 can be provided at the right distal end of the rail 801, such that the plurality of ESLs 830 are to the left of the controllable short 840. The controllable short 840 can be controlled to create or remove a short circuit between the first conductor 804 and the second conductor 805 of the rail 801, where the controlled short circuit is located at the second end of the rail 801, opposite from the first end of the rail 801 that is attached to the peak detection circuit 810. In one illustrative example, the systems and techniques can perform distance estimation to the location of the plurality of ESLs 830 based on configuring the controllable short 840 to cause a short circuit across the first and second conductors 804, 805 of the rail 801 when each respective ESL 830 injects its corresponding pulse signal 833 into the rail 801.

For instance, FIG. 8B corresponds to an example where a pulse signal 833 is injected by the ESL 830 (e.g., injected by pulse circuit 835 included in the ESL 830) into the rail 801. The pulse 833 can be represented by a function P(t), in units of volts and as a function of time 1. The pulse 833 can be injected at a location d=0, which is a distance a along the rail 801. For example, as shown in FIG. 8B, the first end of the rail 801 (e.g., the interface between the rail 801 and the peak detection circuit 810) can correspond to a location d=−a. The second end of the rail 801 (e.g., the interface between the rail 801 and the controllable short 840) can correspond to a location d=b.

With reference to FIGS. 8A and 8B, the term a can represent the distance from the device 830 to the first end (e.g., near end/left end) of the rail 801. The term b can represent the distance from the device 830 to the second end (e.g., far end/right end) of the rail 801. The term c can represent the speed of light within the rail 801 and/or conductors 804, 805. The term d can represent distance along the rail 801, with d=0 corresponding to the location of the ESL 830. The total length of the rail 801 can be given by a+b. Time is represented as t.

In some examples, as the injected pulse 833 travels along the rail 801, the pulse can be described using the 1-D wave equation in terms of time (t) and distance (d). The injected pulse signal 833 can flow (e.g., travel or propagate, etc.) in a first direction 822 and a second direction 827, described by the "−" and "+" suffixes, respectively. For instance, the direction 822 can be referred to as a negative or "−" direction and the direction 827 can be referred to as a positive of "+" direction.

The injected pulse signal P(t) 833 traveling in the negative direction 822 along the first conductor 804 of rail 801 can be given as the reverse signal $$V_P^-(t, d):$$

$$V_p^-(t, d) = P\left(t + \frac{d}{c}\right) \qquad \text{Eq. (1)}$$

The injected pulse signal P(t) 833 traveling in the positive direction 827 along the first conductor 804 of rail 801 can be given as the forward signal $$V_P^+(t, d):$$

$$V_p^+(t, d) = P\left(t - \frac{d}{c}\right) \qquad \text{Eq. (2)}$$

In Eqs. (1) and (2), the variables V and P are given in units of volts. The forward signal 827 of Eq. (2) can reflect off of the controllable short 840 provided at the second end of the rail 801. Reflection off of the controllable short 840 causes the forward signal $$V_P^+(t, d) \, 827$$

to be inverted in pulse direction and pulse magnitude, given as the reverse signal $$V_R^-(t, d)$$

traveling along the second conductor 805 of rail 801, in the reverse or "−" direction:

$$V_R^-(t, d) = -P\left(t - \frac{2b - d}{c}\right) \qquad \text{Eq. (3)}$$

The peak detection circuit 810 sees a voltage $V_{PD}(t)$, which varies over time t only. The voltage $V_{PD}(t)$ received and/or measured by the peak detection circuit 810 is a combination of the two reverse signals:

$$V_{\bar{P}}(t, d)\,822$$

of Eq. (1), received by the peak detection circuit 810 on first conductor 804, and $$V_{\bar{R}}(t, d)\,827$$

of Eq. (2), received by the peak detection circuit 810 on the second conductor 805.

The voltage at the peak detection circuit 810 (e.g., the combined voltage, $V_{PD}(t)$, of the two reverse signals) is sampled at the location d=−a, and can be given as:

$$V_{PD}(t) = V_{\bar{P}}(t, -a) + V_{\bar{R}}(t, -a) = P\left(t - \frac{a}{c}\right) - P\left(t - \frac{2b+a}{c}\right) \quad \text{Eq. (4)}$$

The pulse 833 can be degraded based on the capacitance of other devices on the rail 801 (e.g., ESLs other than the ESL 830 configured to inject the pulse 833). In some examples, a degradation factor k can be used to model the exponential reduction in pulse voltage over distance, due to the presence of other uniformly distributed devices along the rail 801. The received pulse voltage $V_{PD}(t)$ over time and measured at the first end of the rail 801 by the peak detection circuit 810 can be approximated as:

$$V_{PD}(t) = P\left(t - \frac{a}{c}\right)e^{-ka} - P\left(t - \frac{2b}{c} - \frac{a}{c}\right)e^{-2kb-ka} \quad \text{Eq. (5)}$$

In one illustrative example, the peak detection circuit 810 can be configured to capture the signal $P_k(a)$=max ($V_{PD}$), which represents the peak voltage for each position a of the ESL or display 830 along the length of the rail 830.

In some aspects, the plot 802a of FIG. 8A depicts the measured peak voltage signal $P_k(a)$ at the peak detection circuit 810 over a range of different distances to the device 830 (e.g., over a range of different distances a along the rail 801). The gradient of the peak voltage vs. distance plot 802a is lower for smaller distance values, and may correspond to a relatively lower accuracy of the distance estimate for locating ESLs or other devices 830 that are relatively near to the first end of rail 801 and the peak detection circuit 810. The gradient of the peak voltage vs. distance plot 802a is higher for larger distance values, and may correspond to a relatively higher accuracy of the distance estimate for locating ESLs or other devices 830 that are relatively near to the second end of rail 801 and the controllable short 840 (e.g., relatively far from the first end of rail 801 and the peak detection circuit 810).

In one illustrative example, the distance estimation technique of FIG. 8A and FIG. 8B can be used to accurately determine the distance from the ESL 830 to the controllable short 840, shown as the distance De in FIG. 8A and the distance b in FIG. 8B. The distance from the ESL 830 to the controllable short 840 can correspond to the relatively high gradient, and corresponding relatively high accuracy distance estimation, region of the peak voltage vs. distance plot 802a.

Figure 8C:
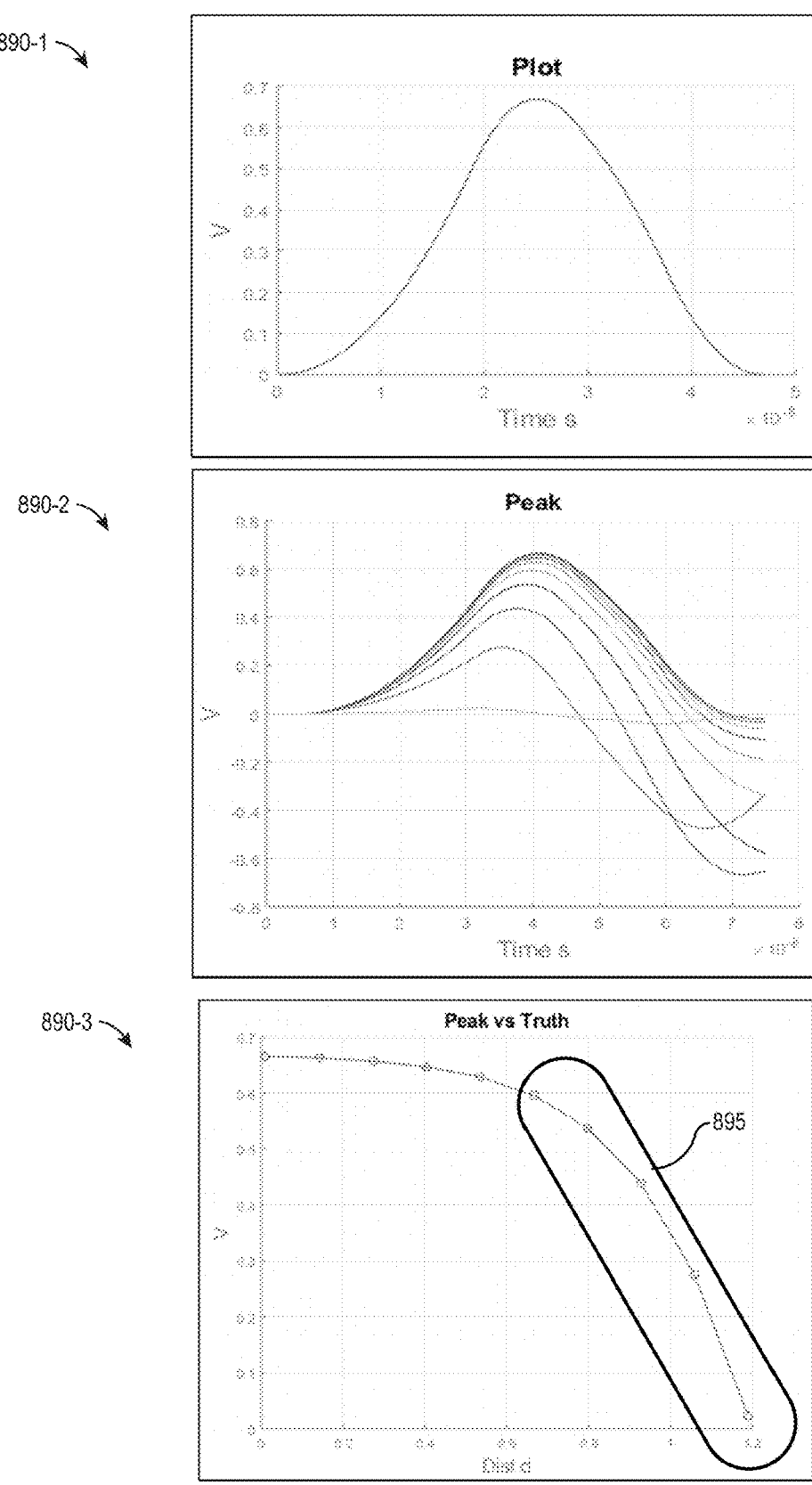
FIG. 8C is a diagram illustrating example voltage plots corresponding to the pulse signals and peak detection circuit of FIG. 8B, in accordance with some examples.

FIG. 8C is a diagram illustrating example voltage plots 890-1, 890-2, 890-3 corresponding to the pulse signals and peak detection circuit of FIG. 8B, in accordance with some examples. For instance, the first voltage plot 890-1 illustrates an example of an input pulse P(t) transmitted or injected by the ESL 830 into the rail 801. In some aspects, the first voltage plot 890-1 illustrates an example input pulse P(t) that is the same as or similar to the injected pulse signal 833 of FIG. 8B.

The second voltage plot 890-2 illustrates respective input signals at the peak detection circuit 810 for various distances 0.01-1.19 m (e.g., the respective signals $V_{PD}(t)$ according to Eq. (5) for various distances 0.01-1.19 m). The signal in plot 890-2 with the lowest peak on the vertical voltage axis corresponds to the distance 0.01 m. The signal in plot 890-2 with the highest peak on the vertical voltage axis corresponds to the distance 1.19 m.

The third voltage plot 890-3 illustrates peak voltage as a function of ESL 830 position along the rail (e.g., peak voltage vs. true distance of the ESL). For 10 other ESL devices on the rail 801 (e.g., in addition to the device 830), the degradation factor k can be approximated as equal to 1.0. The gradient of the peak voltage vs. true distance of the ESL is significantly increased within the region 895, corresponding to relatively larger distances of the ESL from the peak detection circuit 810. In some aspects, the distance estimation and on-rail device location of FIGS. 7A-8C can be implemented based on an initial calibration of the peak detect and pulse circuit(s) 810 and the respective pulse circuit 835 included within each ESL device 830.

As noted previously, a pulse signal transmitted by an ESL or other device coupled to the rail propagates in both the left (e.g., reverse or "−") and right (e.g., forward or "+") directions. With reference to FIGS. 8A-8B, the forward pulse 827 on the first conductor 804 of the rail 801 hits the controllable short 840 and is reflected in the inverse direction (e.g., is reflected in the reverse direction) along the second conductor 805 of the rail 801.

In some aspects, the reflected reverse pulse 824 originates at the location d=b, at the far right end (e.g., second end) of the rail 801, at the location of the controllable short 840 with d=b. When the reflected reverse pulse 824 returns to the location d=0 of the particular ESL device 830 for which the current distance estimation is performed, the reflected reverse pulse 824 intercepts the still-outgoing forward pulse 827 (e.g., based on the pulse signal 833 injected into the rail 801 having a pulse width or pulse duration that is larger than the speed of light in the rail, c, divided by the distance 2b (e.g., the distance 1b traveled by the outgoing forward signal 827 from device 830 to short 840+the distance 1b traveled by the reflected reverse signal 824 from short 840 to device 830)).

The interception of the still-outgoing forward signal 827 by the reflected reverse signal 824 at the location of the ESL device 830 being measured (e.g., the ESL 830 for which distance estimation is being performed) can correspond to the creation of a difference signal, the same as or similar to the difference signal described above with respect to FIGS. 3A-7B.

The difference signal measured at the peak detection circuit 810 and/or the difference signal corresponding to the interception of the still-outgoing forward signal 827 by the reflected reverse signal 824 at the location of the ESL device 830 being measured can be used to measure or estimate the distance from the device 830 to the end of the rail. For instance, the difference signal can be used to estimate or measure the distance "De" shown in FIG. 8A between the device 830 under measurement to the controllable short 840 at the far/second end of the rail 801 (e.g., the distance "b" shown in FIG. 8B).

In one illustrative example, the two signals that propagate leftward from the device under measure 830 (e.g., the first reverse signal 822 and the reflected reverse signal 824) do not change relative to one another, and the peak voltage signal captured at the peak detection circuit 810 (e.g., the signal $P_k(a)$=max ($V_{PD}$), with $V_{PD}$ given by Eq. (4) and/or Eq. (5)) encodes the distance from the device under measure 830 to the controllable short 840 and the far end of the rail 801.

In one illustrative example, the systems and techniques described herein can perform distance estimation for a plurality of ESLs or other devices along a rail based on a combination of the distance estimation techniques of FIGS. 3A-7B (e.g., where each ESL or other device is configured to cause a controllable short across the rail in order to determine a respective first distance estimate for the ESL) and the distance estimation techniques of FIGS. 8A-8C (e.g., where each ESL or other device is configured to inject a pulse signal into the rail in order to determine a respective second distance estimate for the ESL).

In some aspects, each device of a plurality of devices coupled to a multi-conductor transmission line (e.g., each ESL of a plurality of ESLs coupled to a rail) can be configured to implement a respective controllable short circuit across the multi-conductor rail. The controllable short circuit can be configured to cause a short circuit between at least two conductors of the rail, at the location where the respective ESL is attached to the rail. For instance, an ESL with a controllable short circuit can cause a short circuit by closing a switch or otherwise establishing a conductive path between a first conductor and second conductor of the rail, where the switch or conductive path of the short circuit is provided at the location of the ESL along the rail.

In one illustrative example, each ESL of the plurality of ESLs can include a pulse circuit configured to inject a respective pulse signal into the rail at the location of the ESL, and a controllable short circuit configured to short across the multiple conductors of the rail at the location of the ESL.

In some aspects, a location of the ESL along the rail can be determined based on a first distance measurement where the ESL is configured to inject a pulse signal into the rail, and a second distance measurement where the ESL is configured to cause a controlled short circuit across the rail.

Figure 9A:
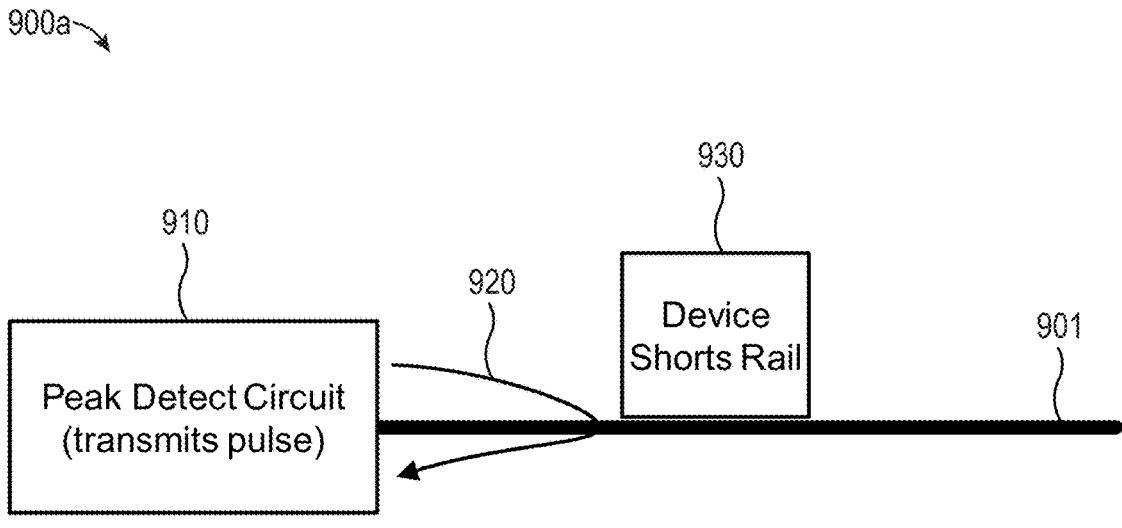
FIG. 9A is a diagram illustrating a first distance measurement configuration between a peak detection circuit and a device coupled to a multi-conductor transmission line, where the device is configured to implement a controllable short circuit, in accordance with some examples.
Figure 9B:
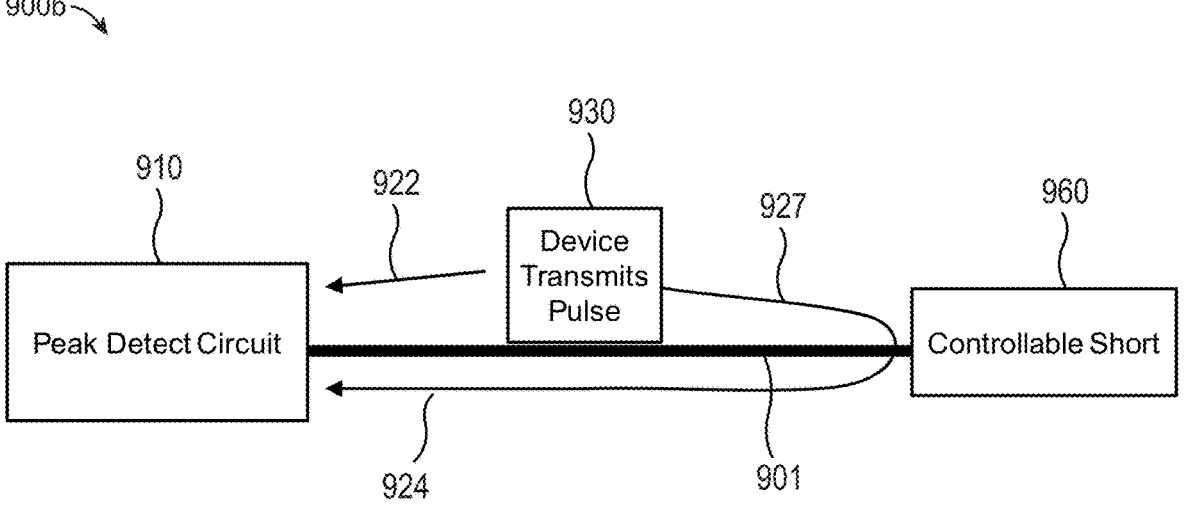
FIG. 9B is a diagram illustrating a second distance measurement configuration between the peak detection circuit and the device of FIG. 9A, wherein the device is configured to transmit a pulse towards the peak detection circuit at a first end of the multi-conductor transmission line and a controllable short circuit device at a second end of the multi-conductor transmission line, in accordance with some examples.

For instance, FIG. 9A is a diagram illustrating a first distance measurement configuration 900a between a peak detection circuit 910 and a device 930 coupled to a multi-conductor rail or transmission line 901, where the peak detection circuit 910 transmit a pulse signal into the rail 901 and the device 930 is configured to implement a controllable short circuit. FIG. 9B is a diagram illustrating a second distance measurement configuration 900b between the peak detection circuit 910 and the device 930 coupled to the rail 930, where the device 930 transmits a pulse signal into the rail 901 and a controllable short 960 causes a short circuit at a far end of the rail 901.

In one illustrative example, the peak detection circuit 910 of FIG. 9A-9B can be a pulse and peak detection circuit. For instance, the peak detection circuit 910 can be the same as or similar to the pulse and peak circuit 710 of FIGS. 7A-7B, the peak detection circuit 810 of FIGS. 8A-8B, etc. The rail 901 of FIGS. 9A-9B can be the same as or similar to the rail 301 of FIGS. 3A-4D, the rail 701 of FIGS. 7A-7B, the rail 801 of FIGS. 8A-8B, etc. The device 930 can be an ESL that includes a pulse circuit (e.g., such as the ESL 830 and pulse circuit 835 of FIG. 8A) and a controllable short circuit. The device 930 can be the same as or similar to the device 402 of FIGS. 4A-4C, the device 400d of FIG. 4D, the device 732 of FIG. 7A, the devices 750 and/or 752 of FIG. 7B, the device 830 of FIGS. 8A-8B, etc.

In the first distance measurement configuration 900a of FIG. 9A, where each device under measure 930 is configured to cause a short across the rail 901, measurements over shorter distances (e.g., closer to the peak detection circuit 910) may be more accurate. In the second distance measurement configuration 900b of FIG. 9B, where each device under measure 930 is configured to inject a pulse signal into the rail 901, measurements over longer distances (e.g., closer to the controllable short 960 at the opposite end of the rail 901 from the peak detection circuit 910) may be more accurate.

In one illustrative example, a distance can be determined for each respective device of a plurality of devices (e.g., ESLs) coupled to a rail (e.g., rail 901) based on a first distance measurement determined using the first distance measurement configuration 900a of FIG. 9A and based on a second distance measurement determined using the second distance measurement configuration 900b of FIG. 9B.

For instance, for a plurality of N ESLs coupled to a rail, a respective distance measurement can be determined for each respective one of the N ESLs based on a total of 2N measurements. N first measurements can be determined based on using the pulse and peak detection circuit 910 to transmit a respective pulse into the rail 901 when each respective ESL is successively configured or controlled to short across the rail 901. For instance, the pulse and peak detection circuit 910 can transmit a first pulse into the rail 901 while only a first ESL of the N ESLs shorts across the rail 901; a second pulse while only a second ESL of the N ESLs shorts across the rail 901; . . . ; and an $N^{th}$ pulse while only an $N^{th}$ ESL of the N ESLs shorts across the rail 901.

An additional N second distance measurements can be determined based on configuring each respective ESL of the N ESLs to use its included pulse circuit to inject a respective pulse signal into the rail 901, while the controllable short 960 at the far end of the rail 901 causes a short circuit across the rail 901. For instance, a first ESL of the N ESLs can inject a pulse signal that is reflected off of the controllable short 960 at the end of the rail and measured as a difference signal or peak voltage $V_{PD}$(t) according to Eq. (4) and/or Eq. (5); subsequently, a second ESL of the N ESLs can inject a pulse signal that is reflected off of the controllable short 960 at the far end of rail 910 and measured as a peak voltage of a difference signal at the peak detection circuit 910; . . . ; and an $N^{th}$ ESL of the N ESLs can inject a pulse signal that is reflected off of the controllable short 960 and measured as a peak voltage of a difference signal at the peak detection circuit 910.

In both the first distance measurement configuration 900a and the second distance measurement configuration 900b, the same peak detection circuit 910 can be used to capture the corresponding peak voltage of the first reflected signal 920 (e.g., corresponding to the first distance measurement configuration 900a) or the corresponding peak voltage of the difference signal between reverse signal 922 and reflected reverse signal 922 (e.g., corresponding to the second distance measurement configuration 900b).

In one illustrative example, the systems and techniques can be configured to determine a respective location for each ESL 930 of a plurality of ESLs coupled to the rail 901, based on determining a first distance estimate according to the first configuration 900*a* of FIG. 9A, using the respective ESL 930 to controllably short across the multi-conductor rail 901 and determining a second distance estimate according to the second configuration 900*b* of FIG. 9B, using the respective ESL 930 to inject a pulse signal while the rail 901 is controllably shorted at its second end by the controllable short 960. In one illustrative example, the respective location of the ESL 930 can be determined based on a combination of the first distance estimate and the second distance estimate. For instance, the respective location of the ESL 930 can be determined based on a weighted combination of the first distance estimate using the ESL 930 as a controllable short and the second distance estimate using the ESL 930 as a pulse injector, where the first distance estimate is given a greater weighting for locations closer to the peak detection and pulse circuit(s) 910 at a first end of the rail 901, and the second distance estimate is given a greater weighting for locations closer to the controllable short 960 at the second end of the rail 901 (e.g., where the second end of the rail 901 is opposite from the first end of the rail 901, and where the plurality of ESLs 930 are coupled to the rail 901 between the first and second ends of the rail 901).

In some aspects, a respective distance measurement or estimate can be determined for each respective ESL of a plurality of ESLs coupled to a rail based on replacing the controllable short at the far end of the rail (e.g., the controllable short 840 at the far end of rail 801 of FIGS. 8A-8B, the controllable short 960 at the far end of rail 901 of FIG. 9B, etc.) with the controllable short circuit mechanism of a second ESL included in the same plurality of ESLs, where the second ESL is located to the right of the ESL 930 that is currently under measurement. For instance, the controllable short can be implemented or caused by any ESL that is closer to the far end or right end of the rail 901 than the ESL 930 under measure.

Using a controllable short implemented or caused by another ESL of the same plurality of ESLs can enable a relative distance estimate to be made between all pairs of ESLs included in the plurality of ESLs, which can increase the accuracy of the distance measurement determined along the length of the rail 901 for each respective ESL of the plurality of ESLs.

Figure 10:
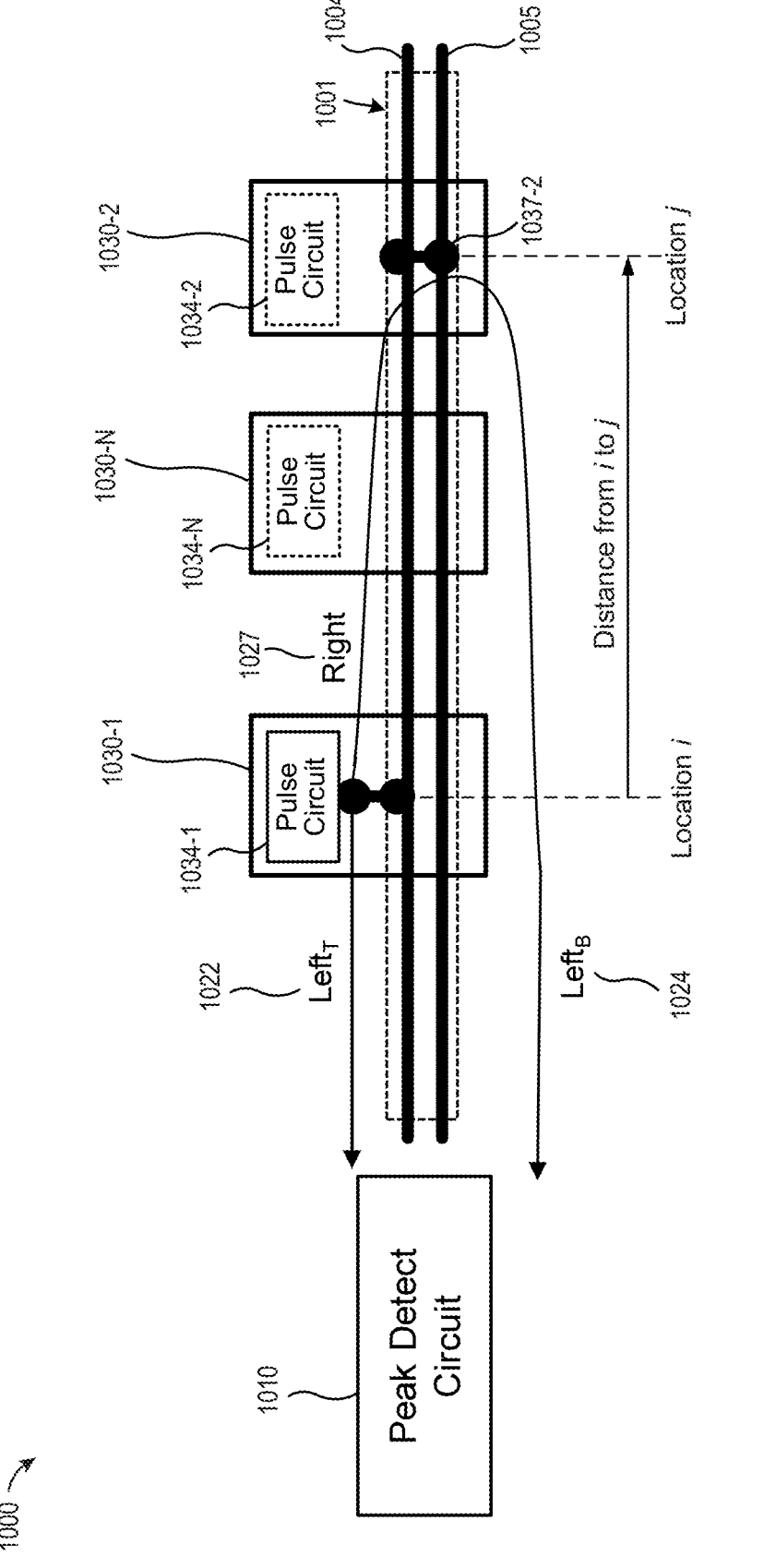
FIG. 10 is a diagram illustrating an example of a system including a peak detection circuit and one or more devices each configurable to transmit a pulse into a multi-conductor transmission line coupled or implement a controllable short circuit across the multi-conductor transmission line, in accordance with some examples.

For instance, FIG. 10 is a diagram illustrating an example of a system with a distance measurement configuration 1000 for determining a respective location or distance along a rail 1001 corresponding to each respective ESL of a plurality of ESLs 1030-1, 1030-2, . . . , 1030-N. The distance measurement configuration 1000 can utilize controllable shorts caused or implemented by other ESLs (e.g., ESLs 1030-N, 1030-2, etc.) other than the ESL 1030-1 currently under measure).

In one illustrative example, a peak detection circuit 1010 can be the same as or similar to the pulse and peak circuit 710 of FIGS. 7A-7B, the peak detection circuit 810 of FIGS. 8A-8B, the peak detection circuit 910 of FIGS. 9A-9B, etc. The rail 1001 can include a first conductor 1004 and a second conductor 1005, which may be the same as or similar to the rail 301 and conductors 304, 305 of FIGS. 3A-4C, respectively; the rail 701 and conductors 704, 705 of FIGS. 7A-7B, respectively; the rail 801 and conductors 804, 805 of FIGS. 8A-8B, respectively; and/or the rail 901 of FIGS. 9A-9B; etc.

The plurality of ESLs 1030-1, 1030-2, . . . , 1030-N can be the same as or similar to the ESLs or other on-rail devices 302 or 402 of FIGS. 3A-4C, 732 of FIG. 7A, 752 of FIG. 7B, 830 of FIGS. 8A-8B, 930 of FIGS. 9A-9B, etc.

A first reverse pulse signal 1022 can be the same as or similar to the reverse pulse signal 822 of FIGS. 8A and 8B and/or the reverse pulse signal 922 of FIG. 9B, given by Eq. (1). A forward pulse signal 1027 can be the same as or similar to the forward pulse signal 827 of FIGS. 8A and 8B and/or the forward pulse signal 927 of FIG. 9B, given by Eq. (2). A reflected reverse pulse signal 1024 can be the same as or similar to the reflected reverse pulse signal 824 of FIGS. 8A and 8B and/or the reflected reverse pulse signal 924 of FIG. 9B, given by Eq. (3). A difference signal of the first and reflected reverse signals 1022, 1024 (respectively) measured at peak detection circuit 1010 can be the same as or similar to the peak detect signal given by Eq. (4) and/or Eq. (5).

In some aspects, each ESL of the plurality of ESLs 1030-1, 1030-2, . . . , 1030-N (e.g., collectively referred to herein as the plurality of ESLs 1030) can be the same. In some aspects, each ESL of the plurality of ESLs 1030 can include a controllable short that can be configured to and/or can cause a short circuit across the conductors 1004, 1005 of the rail 1001 and can include a pulse circuit that can be configured to inject a pulse circuit into the rail 1001. For instance, the ESL 1030-1 can include a pulse circuit 1034-1, the ESL 1030-2 can include a pulse circuit 1034-2, the ESL 1030-N can include a pulse circuit 1034-N, etc. Each ESL of the plurality of ESLs 1030 can include a same or similar pulse circuit, and can inject a same or different pulse signal as the remaining ESLs of the plurality of ESLs 1030.

To determine the respective location or distance measurement(s) for a respective ESL the plurality of ESLs 1030, a first ESL 1030-1 can be selected from the plurality of ESLs 1030 as the ESL currently under measure. A second ESL 1030-2 can be selected from the plurality of ESLs 1030 as the controlled short ESL that is configured to cause a controlled short 1037-2 across the rail 1001 at the location of the second ESL 1030-2.

The second ESL 1030-2 that is configured to cause the controlled short 1037-2 across the rail 1001 will thereby reflect the forward pulse signal 1027 received on the first conductor 1004 from the first ESL 1030-1 (e.g., ESL under measure) onto the second conductor 1005 as the reflected reverse signal 1024.

The pulse circuit in each ESL 1030-2, . . . , 1030-N that is not the ESL currently under measure can be deactivated or otherwise not used during the measurement of the distance for the ESL 1030-1 under measure. In some aspects, respective measurements can be determined for each ESL of the plurality of ESLs 1030 based on selecting the controlled short ESL 1030-2 from the subset of ESLs that are farther away from the peak detection circuit 1010 than the ESL 1030-1 currently under measure (e.g., the subset of ESLs that are to the right of the ESL 1030-1 currently under measure, in the example of FIG. 10). If the controlled short ESL is selected as an ESL that is closer to the peak detection circuit 1010 than the ESL 1030-1 currently under measure, no signal is detected at the peak detection circuit 1010 (e.g., based on the reverse signal 1022 and reflected reverse signal 1024 hitting the short in the rail 1001 and being unable to reach the peak detection circuit 1010.

In some aspects, a controller associated with the plurality of ESLs 1030, the rail 1001, and/or the peak detection circuit 1010 (e.g., a rail controller, etc.) can be configured to controllably short across the rail 1001 using different ones of the plurality of ESLs 1030 in order to quickly determine a relative ordering of the ESLs 1030 along the length of the rail 1001, without performing a full measurement.

For instance, the controller can select a first ESL m as the ESL under measure and can select a second ESL n as the controlled short ESL. The first ESL m can inject a pulse signal and the second ESL n can cause a controlled short across the rail 1001. If the peak detection circuit 1010 measures a peak voltage difference signal, the second ESL n is identified as being located to the right of the first ESL m (e.g., the second ESL n is located farther away from the peak detection circuit 1010 than the first ESL m, based on the controlled short not preventing the peak detection circuit 1010 from receiving a difference signal). If the peak detection circuit 1010 does not measure a peak voltage difference signal, the second ESL n is identified as being located to the left of the first ESL m (e.g., the second ESL n is located closer to the peak detection circuit 1010 than the first ESL m, based on the controlled short preventing the peak detection circuit 1010 from receiving a difference signal).

The process can be repeated for various different combinations and permutations of the currently under measure ESL m and the controlled short ESL n until a full relative order has been determined to place each respective ESL of the plurality of ESLs 1030 within a relative ordering along the length of the rail 1001. Determining a relative order without determining a precise location or distance measurement for each ESL can save time and power, while still providing relative order and relative position information for the plurality of ESLs 1030 along the length of the rail 1001.

Figure 11:
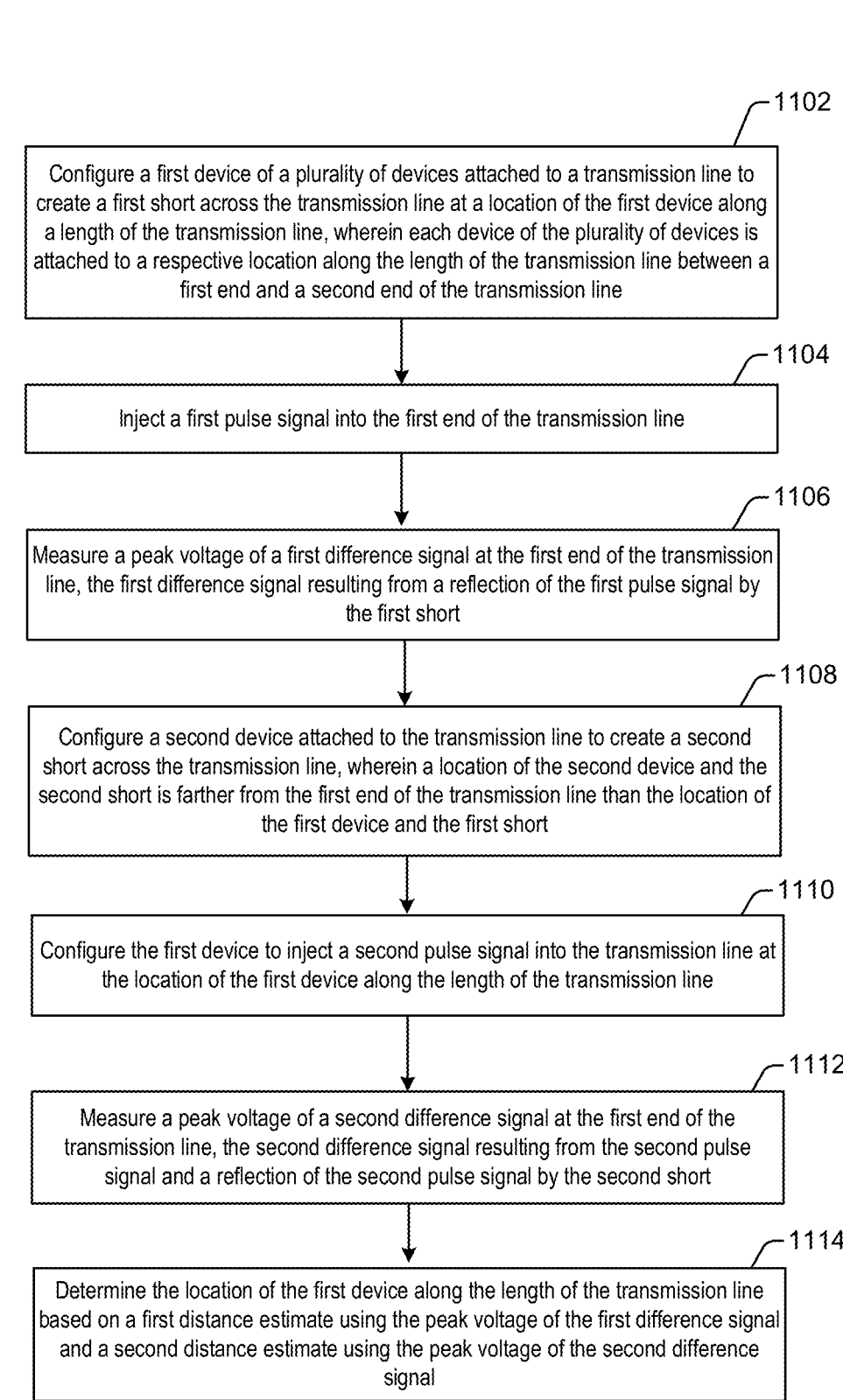
FIG. 11 is a flowchart diagram illustrating an example of a process for wireless communications, in accordance with some examples.

FIG. 11 is a flow chart illustrating an example of a process 1100 for wireless communications. The process 1100 can be performed by a network entity (e.g., such as an access point, central device, ESL rail controller, etc.) and/or a network device (e.g., such as an AP) or by a component or system (e.g., a chipset, one or more processors such as one or more microprocessors, graphics processing units (GPUs), digital signal processors (DSPs), central processing units (CPUs), neural processing units (NPUs), neural signal processors (NSPs), etc., any combination thereof, and/or other component or system) of the network entity.

Figure 12:
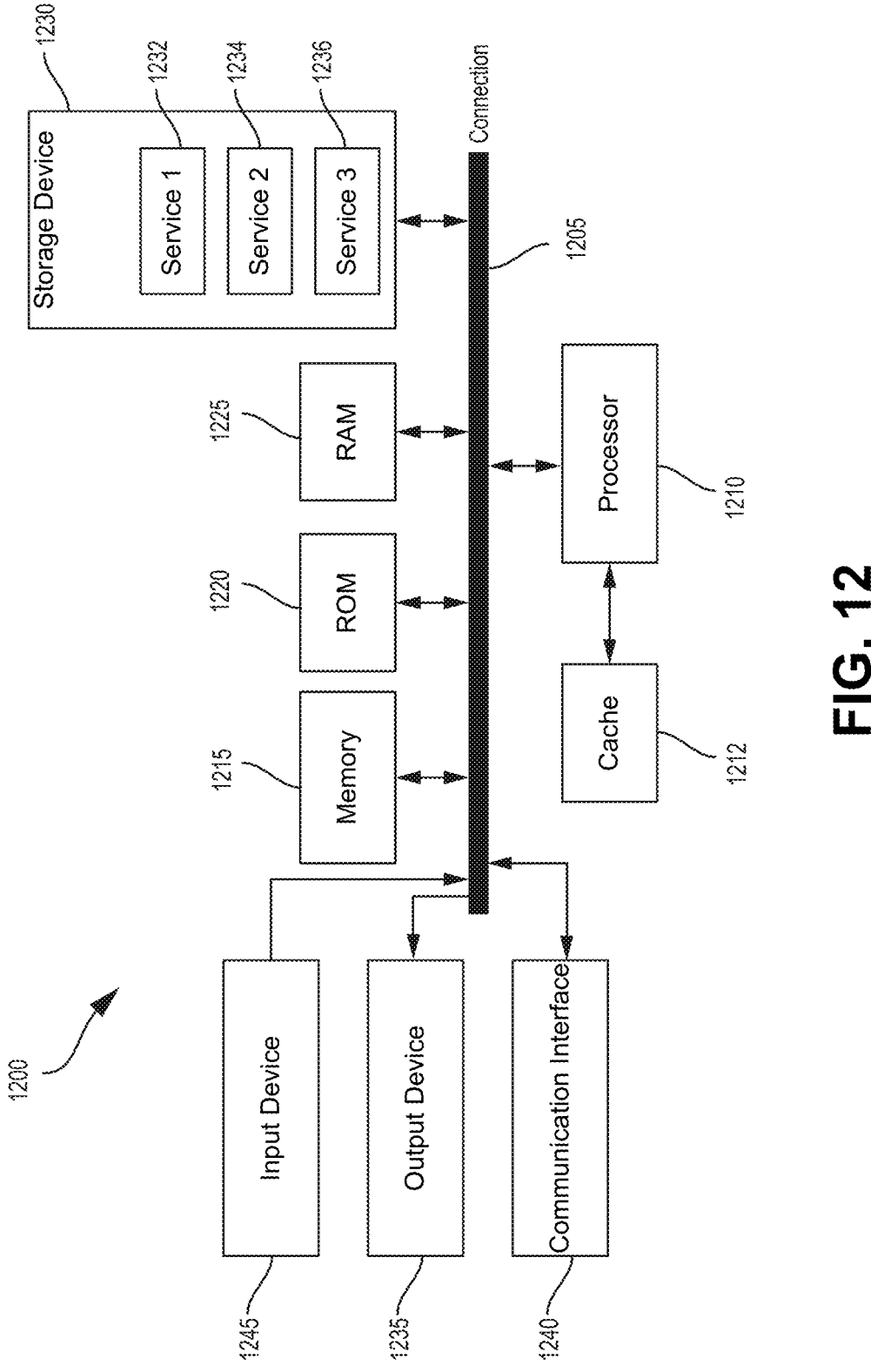
FIG. 12 is a block diagram illustrating an example of a computing system, which may be employed by the disclosed systems and techniques, in accordance with some examples.

The operations of the process 1100 may be implemented as software components that are executed and run on one or more processors (e.g., processor 1210 of FIG. 12 or other processor(s)). Further, the transmission and reception of signals by the network entity in the process 1100 may be enabled, for example, by one or more antennas and/or one or more transceivers (e.g., wireless transceiver(s)).

At block 1102, the network device (or component thereof) can configure a first device of a plurality of devices attached to a transmission line to create a first short across the transmission line at a location of the first device along a length of the transmission line, wherein each device of the plurality of devices is attached to a respective location along the length of the transmission line between a first end and a second end of the transmission line.

For example, the first device and/or the plurality of devices can be provided as ESLs and/or other devices, such as the wireless communication device(s) 120 of FIG. 1, the device having the architecture 200 of FIG. 2, the controllable short circuit device 309 of FIG. 3B, the controllable short circuit devices 402 of FIGS. 4A-4C, the device 400d of FIG. 4D, the controllable short circuit device 732 of FIG. 7A, the controllable short circuit device 750 and/or 752 of FIG. 7B, the controllable short circuit device 830 of FIG. 8A, the controllable short circuit device 840 of FIGS. 8A-8B, the device 930 of FIG. 9A-9B, the controllable short 960 of FIG. 9B, the controllable short circuit device 1030-1, 103-2, 1030-N of FIG. 10, etc.

In some cases, the transmission line can be a multi-conductor transmission line, and can include two or more conductors. In some cases, the multi-conductor transmission line can be a multi-conductor rail, such as an ESL rail, etc. In some examples, the transmission line can be the same as or similar to the multi-conductor transmission line 301 of FIGS. 3A-4C (e.g., including a first conductor 304 and a second conductor 305), the multi-conductor transmission line 701 of FIGS. 7A-7B (e.g., including a first conductor 704 and a second conductor 705), the multi-conductor transmission line 801 of FIGS. 8A-8B (e.g., including a first conductor 804 and a second conductor 805), the transmission line 901 of FIGS. 9A-9B, and/or the multi-conductor transmission line 1001 of FIG. 10 (e.g., including a first conductor 1004 and a second conductor 1005), etc.

In some examples, the first device can be the short circuit device 732 of FIG. 7A and the first short across the transmission line can be the short 739 of FIG. 7A. In some cases, the first device can be the short circuit device 752 of FIG. 7B and the first short across the transmission line can be the short 759. In some cases, the first device can be the short circuit device 930 of FIGS. 9A-9B and the first short across the transmission line can be the short implemented by the device 930 in FIG. 9A. In some cases, the first device can be the short circuit device 1030-1 of FIG. 10 and the first short across the transmission line can be the short caused by the short circuit device 1030-1 across the transmission line 1001 of FIG. 10.

In some examples, each device of the plurality of devices includes a controllable short circuit configured to create a respective short across the transmission line at the respective location of each device along the length of the transmission line. In some examples, each device of the plurality of devices further includes a pulse circuit configured to inject a respective pulse signal into the transmission line at the respective location of each device along the length of the transmission line. For example, each device of the plurality of devices can be the same as or similar to the device 830 of FIG. 8A, including the pulse circuit 835; the device 930 of FIGS. 9A-9B, configured to cause a short and/or inject a pulse into transmission line 901; and/or the devices 1030-1, 103-2, 1030-N of FIG. 10, including the respective pulse circuits 1034-1, 1034-2, 1034-N.

In some examples, the transmission line comprises a multi-conductor rail and the plurality of devices comprises a plurality of Electronic Shelf Labels (ESLs) coupled to the multi-conductor rail.

At block 1104, the network device (or component thereof) can inject a first pulse signal into the first end of the transmission line. For example, the first pulse signal can be the same as or similar to the pulse signal 920 transmitted by the peak and pulse circuit 910 of FIG. 9A. In some cases, the first pulse signal is injected in a forward direction along the length of the transmission line, wherein the forward direction is from the first end to the second end of the transmission line. In some examples, a reflection of the first pulse signal by the first short results in a first reflected reverse signal propagated in a reverse direction from the location of the first device to the first end of the transmission line.

At block 1106, the network device (or component thereof) can measure a peak voltage of a first difference signal at the first end of the transmission line, the first difference signal resulting from a reflection of the first pulse signal by the first short. For example, the peak voltage of the first difference signal can be measured by a peak detection circuit coupled to the first end of the transmission line. In some cases, the peak detection circuit can be the same as or similar to a peak detection circuit 306 of FIGS. 3A-4C, the pulse and peak circuit 710 of FIGS. 7A-7B, the pulse and peak circuit 810 of FIGS. 8A-8B, the peak detect circuit 910 of FIGS. 9A-9B, and/or the peak detect circuit 1010 of FIG. 10, etc. In some examples, the peak detection circuit includes a pulse circuit, and the first pulse signal is injected using the pulse circuit.

At block 1107, the network device (or component thereof) can configure a second device attached to the transmission line to create a second short across the transmission line, wherein a location of the second device and the second short is farther from the first end of the transmission line than the location of the first device and the first short.

In some cases, the second device comprises a controllable short circuit device coupled to the second end of the transmission line. For example, the second device can be the same as or similar to the controllable short circuit device 840 of FIGS. 8A-8B, the controllable short circuit device 960 of FIG. 9B, etc. In some examples, the second device is not included in the plurality of devices.

In some examples, the second device is included in the plurality of devices (e.g., the same plurality of devices as the first device). In some cases, the second device and the first device can be the same type of device, ESL, etc. In some cases, the second device includes a controllable short circuit configured to create the second short across the transmission line at the location of the second device along the length of the transmission line. In some examples, the second device further includes a pulse circuit configured to inject one or more pulse signals into the transmission line at the location of the second device along the length of the transmission line. In some examples, the second device is selected from the plurality of devices based on the location of the second device being closer to the second end of the transmission line than the location of the first device to the second end of the transmission line.

At block 1110, the network device (or component thereof) can configure the first device to inject a second pulse signal into the transmission line at the location of the first device along the length of the transmission line. For example, the first device can inject a second pulse signal corresponding to the left and right injected pulse signals 822 and 827 (respectively) injected by the pulse circuit 835 of the device 830 of FIGS. 8A-8B. In some cases, the second pulse signal can correspond to the left and right injected pulse signals 922 and 927, respectively, of FIG. 9B. In some examples, the second pulse signal can correspond to the left and right injected pulse signals 1022 and 1027, respectively, of FIG. 10.

In some examples, the second pulse signal injected at the location of the first device results in a reverse pulse signal propagated in the reverse direction from the respective location of the first device, and a forward pulse signal propagated in the forward direction from the location of the first device. In some cases, the reflection of the second pulse signal by the second short comprises a reflection of the forward pulse signal into a second reflected reverse signal propagated in the reverse direction from the location of the second short.

At block 1112, the network device (or component thereof) can measure a peak voltage of a second difference signal at the first end of the transmission line, the second difference signal resulting from the second pulse signal and a reflection of the second pulse signal by the second short. In some examples, the peak voltage of the first difference signal and the peak voltage of the second difference signal are measured by the same peak detection circuit coupled to the first end of the transmission line.

At block 1114, the network device (or component thereof) can determine the location of the first device along the length of the transmission line based on a first distance estimate using the peak voltage of the first difference signal and a second distance estimate using the peak voltage of the second difference signal.

In some examples, the peak voltage of the first difference signal and the peak voltage of the second difference signal are measured by a peak detection circuit coupled to the first end of the transmission line. In some cases, the respective location of each device of the plurality of devices is along the length of the transmission line between the peak detection circuit at the first end of the transmission line and the controllable short circuit device at the second end of the transmission line.

In some examples, the network device (or component thereof) is configured to determine the respective location of each device of the plurality of devices, based on a respective first distance estimate determined from a respective peak voltage of a first difference signal determined using a controlled short caused by each device at the respective location of each device, and a respective second distance estimate determined from a respective peak voltage of a second difference signal determined using a pulse signal injected by each device at the respective location of each device. In some examples, the respective location of each device comprises a weighted combination of the first distance estimate and the second distance estimate. In some cases, a respective weight for the first distance estimate is larger than a respective weight for the second distance estimate, based on the respective location of each device being closer to the first end of the transmission line than the second end of the transmission line. In some cases, the respective weight for the first distance estimate is smaller than the respective weight for the second distance estimate, based on the respective location of each device being closer to the second end of the transmission line than the first end of the transmission line.

In some examples, the first device and the second device are selected from the plurality of devices as a random pair of devices. In some cases, the network device (or component thereof) is configured to determine that a distance from the first end of the transmission line to the first device is smaller than a distance from the first end of the transmission line to the second device, based on detecting the second difference signal on the transmission line after injection of the second pulse signal. In some examples, the network device (or component thereof) is configured to determine that the distance from the first end of the transmission line to the first device is larger than the distance from the first end of the transmission line to the second device, based on not detecting the second difference signal on the transmission line after injection of the second pulse signal.

In some examples, the network device (or component thereof) is further configured to determine a relative order of the plurality of devices along the length of the transmission line, based on selecting a plurality of random pairs of devices and detecting or not detecting a respective resulting second difference signal on the transmission line after injection of a respective second pulse signal by the first device of each random pair.

The network entity, network device, and/or the wireless communication device may include various components, such as one or more input devices, one or more output devices, one or more processors, one or more microprocessors, one or more microcomputers, one or more cameras, one or more sensors, one or more receivers, transmitters, and/or transceivers, and/or other component(s) that are configured to carry out the steps of processes described herein. In some examples, the computing device may include a display, a network interface configured to communicate and/or receive the data, any combination thereof, and/or other component(s). The network interface may be configured to communicate and/or receive Internet Protocol (IP) based data or other type of data.

The components of a device configured to perform the process 1100 of FIG. 11 can be implemented in circuitry. For example, the components can include and/or can be implemented using electronic circuits or other electronic hardware, which can include one or more programmable electronic circuits (e.g., microprocessors, graphics processing units (GPUs), digital signal processors (DSPs), central processing units (CPUs), and/or other suitable electronic circuits), and/or can include and/or be implemented using computer software, firmware, or any combination thereof, to perform the various operations described herein.

The process 1100 is illustrated as logical flow diagrams, the operation of which represents a sequence of operations that can be implemented in hardware, computer instructions, or a combination thereof. In the context of computer instructions, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types. The order in which the operations are described is not intended to be construed as a limitation, and any number of the described operations can be combined in any order and/or in parallel to implement the processes.

Additionally, the process 1100 and/or other processes described herein may be performed under the control of one or more computer systems configured with executable instructions and may be implemented as code (e.g., executable instructions, one or more computer programs, or one or more applications) executing collectively on one or more processors, by hardware, or combinations thereof. As noted above, the code may be stored on a computer-readable or machine-readable storage medium, for example, in the form of a computer program comprising a plurality of instructions executable by one or more processors. The computer-readable or machine-readable storage medium may be non-transitory.

FIG. 12 is a block diagram illustrating an example of a computing system 1200, which may be employed by the disclosed systems and techniques. In particular, FIG. 12 illustrates an example of computing system 1200, which can be, for example, any computing device making up internal computing system, a remote computing system, a camera, or any component thereof in which the components of the system are in communication with each other using connection 1205. Connection 1205 can be a physical connection using a bus, or a direct connection into processor 1210, such as in a chipset architecture. Connection 1205 can also be a virtual connection, networked connection, or logical connection.

In some aspects, computing system 1200 is a distributed system in which the functions described in this disclosure can be distributed within a datacenter, multiple data centers, a peer network, etc. In some aspects, one or more of the described system components represents many such components each performing some or all of the function for which the component is described. In some aspects, the components can be physical or virtual devices.

Example system 1200 includes at least one processing unit (CPU or processor) 1210 and connection 1205 that communicatively couples various system components including system memory 1215, such as read-only memory (ROM) 1220 and random-access memory (RAM) 1225 to processor 1210. Computing system 1200 can include a cache 1212 of high-speed memory connected directly with, in close proximity to, or integrated as part of processor 1210.

Processor 1210 can include any general-purpose processor and a hardware service or software service, such as services 1232, 1234, and 1236 stored in storage device 1230, configured to control processor 1210 as well as a special-purpose processor where software instructions are incorporated into the actual processor design. Processor 1210 may essentially be a completely self-contained computing system, containing multiple cores or processors, a bus, memory controller, cache, etc. A multi-core processor may be symmetric or asymmetric.

To enable user interaction, computing system 1200 includes an input device 1245, which can represent any number of input mechanisms, such as a microphone for speech, a touch-sensitive screen for gesture or graphical input, keyboard, mouse, motion input, speech, etc. Computing system 1200 can also include output device 1235, which can be one or more of a number of output mechanisms. In some instances, multimodal systems can enable a user to provide multiple types of input/output to communicate with computing system 1200.

Computing system 1200 can include communications interface 1240, which can generally govern and manage the user input and system output. The communication interface may perform or facilitate receipt and/or transmission wired or wireless communications using wired and/or wireless transceivers, including those making use of an audio jack/plug, a microphone jack/plug, a universal serial bus (USB) port/plug, an Apple™ Lightning™ port/plug, an Ethernet port/plug, a fiber optic port/plug, a proprietary wired port/plug, 3G, 4G, 5G and/or other cellular data network wireless signal transfer, a Bluetooth™ wireless signal transfer, a Bluetooth™ low energy (BLE) wireless signal transfer, an IBEACON™ wireless signal transfer, a radio-frequency identification (RFID) wireless signal transfer, near-field communications (NFC) wireless signal transfer, dedicated short range communication (DSRC) wireless signal transfer, 802.11 Wi-Fi wireless signal transfer, wireless local area network (WLAN) signal transfer, Visible Light Communication (VLC), Worldwide Interoperability for Microwave Access (WiMAX), Infrared (IR) communication wireless signal transfer, Public Switched Telephone Network (PSTN) signal transfer, Integrated Services Digital Network (ISDN) signal transfer, ad-hoc network signal transfer, radio wave signal transfer, microwave signal transfer, infrared signal transfer, visible light signal transfer, ultraviolet light signal transfer, wireless signal transfer along the electromagnetic spectrum, or some combination thereof.

The communications interface 1240 may also include one or more range sensors (e.g., LIDAR sensors, laser range finders, RF radars, ultrasonic sensors, and infrared (IR) sensors) configured to collect data and provide measurements to processor 1210, whereby processor 1210 can be configured to perform determinations and calculations needed to obtain various measurements for the one or more range sensors. In some examples, the measurements can include time of flight, wavelengths, azimuth angle, elevation angle, range, linear velocity and/or angular velocity, or any combination thereof. The communications interface 1240 may also include one or more Global Navigation Satellite System (GNSS) receivers or transceivers that are used to determine a location of the computing system 1200 based on receipt of one or more signals from one or more satellites associated with one or more GNSS systems. GNSS systems include, but are not limited to, the US-based GPS, the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

Storage device 1230 can be a non-volatile and/or non-transitory and/or computer-readable memory device and can be a hard disk or other types of computer readable media which can store data that are accessible by a computer, such as magnetic cassettes, flash memory cards, solid state memory devices, digital versatile disks, cartridges, a floppy disk, a flexible disk, a hard disk, magnetic tape, a magnetic strip/stripe, any other magnetic storage medium, flash memory, memristor memory, any other solid-state memory, a compact disc read only memory (CD-ROM) optical disc, a rewritable compact disc (CD) optical disc, digital video disk (DVD) optical disc, a blu-ray disc (BDD) optical disc, a holographic optical disk, another optical medium, a secure digital (SD) card, a micro secure digital (microSD) card, a Memory Stick® card, a smartcard chip, a EMV chip, a subscriber identity module (SIM) card, a mini/micro/nano/pico SIM card, another integrated circuit (IC) chip/card, random access memory (RAM), static RAM (SRAM), dynamic RAM (DRAM), read-only memory (ROM), programmable read-only memory (PROM), erasable programmable read-only memory (EPROM), electrically erasable programmable read-only memory (EEPROM), flash EPROM (FLASHEPROM), cache memory (e.g., Level 1 (L1) cache, Level 2 (L2) cache, Level 3 (L3) cache, Level 4 (L4) cache, Level 5 (L5) cache, or other (L #) cache), resistive random-access memory (RRAM/ReRAM), phase change memory (PCM), spin transfer torque RAM (STT-RAM), another memory chip or cartridge, and/or a combination thereof.

The storage device 1230 can include software services, servers, services, etc., that when the code that defines such software is executed by the processor 1210, it causes the system to perform a function. In some aspects, a hardware service that performs a particular function can include the software component stored in a computer-readable medium in connection with the necessary hardware components, such as processor 1210, connection 1205, output device 1235, etc., to carry out the function. The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data can be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

Specific details are provided in the description above to provide a thorough understanding of the aspects and examples provided herein, but those skilled in the art will recognize that the application is not limited thereto. Thus, while illustrative aspects of the application have been described in detail herein, it is to be understood that the inventive concepts may be otherwise variously embodied and employed, and that the appended claims are intended to be construed to include such variations, except as limited by the prior art. Various features and aspects of the above-described application may be used individually or jointly. Further, aspects can be utilized in any number of environments and applications beyond those described herein without departing from the broader scope of the specification. The specification and drawings are, accordingly, to be regarded as illustrative rather than restrictive. For the purposes of illustration, methods were described in a particular order. It should be appreciated that in alternate aspects, the methods may be performed in a different order than that described.

For clarity of explanation, in some instances the present technology may be presented as including individual functional blocks comprising devices, device components, steps or routines in a method embodied in software, or combinations of hardware and software. Additional components may be used other than those shown in the figures and/or described herein. For example, circuits, systems, networks, processes, and other components may be shown as components in block diagram form in order not to obscure the aspects in unnecessary detail. In other instances, well-known circuits, processes, algorithms, structures, and techniques may be shown without unnecessary detail in order to avoid obscuring the aspects.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Individual aspects may be described above as a process or method which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

Processes and methods according to the above-described examples can be implemented using computer-executable instructions that are stored or otherwise available from computer-readable media. Such instructions can include, for example, instructions and data which cause or otherwise configure a general-purpose computer, special purpose computer, or a processing device to perform a certain function or group of functions. Portions of computer resources used can be accessible over a network. The computer executable instructions may be, for example, binaries, intermediate format instructions such as assembly language, firmware, source code. Examples of computer-readable media that may be used to store instructions, information used, and/or information created during methods according to described examples include magnetic or optical disks, flash memory, USB devices provided with non-volatile memory, networked storage devices, and so on.

In some aspects the computer-readable storage devices, mediums, and memories can include a cable or wireless signal containing a bitstream and the like. However, when mentioned, non-transitory computer-readable storage media expressly exclude media such as energy, carrier signals, electromagnetic waves, and signals per se.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof, in some cases depending in part on the particular application, in part on the desired design, in part on the corresponding technology, etc.

The various illustrative logical blocks, modules, and circuits described in connection with the aspects disclosed herein may be implemented or performed using hardware, software, firmware, middleware, microcode, hardware description languages, or any combination thereof, and can take any of a variety of form factors. When implemented in software, firmware, middleware, or microcode, the program code or code segments to perform the necessary tasks (e.g., a computer-program product) may be stored in a computer-readable or machine-readable medium. A processor(s) may perform the necessary tasks. Examples of form factors include laptops, smart phones, mobile phones, tablet devices or other small form factor personal computers, personal digital assistants, rackmount devices, standalone devices, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are example means for providing the functions described in the disclosure.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the methods, algorithms, and/or operations described above. The computer-readable data storage medium may form part of a computer program product, which may include packaging materials. The computer-readable medium may comprise memory or data storage media, such as random-access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

The program code may be executed by a processor, which may include one or more processors, such as one or more digital signal processors (DSPs), general purpose microprocessors, an application specific integrated circuits (ASICs), field programmable logic arrays (FPGAs), or other equivalent integrated or discrete logic circuitry. Such a processor may be configured to perform any of the techniques described in this disclosure. A general-purpose processor may be a microprocessor; but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein.

One of ordinary skill will appreciate that the less than ("<") and greater than (">") symbols or terminology used herein can be replaced with less than or equal to ("≤") and greater than or equal to ("≥") symbols, respectively, without departing from the scope of this description.

Where components are described as being "configured to" perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

The phrase "coupled to" or "communicatively coupled to" refers to any component that is physically connected to another component either directly or indirectly, and/or any component that is in communication with another component (e.g., connected to the other component over a wired or wireless connection, and/or other suitable communication interface) either directly or indirectly.

Claim language or other language reciting "at least one of" a set and/or "one or more" of a set indicates that one member of the set or multiple members of the set (in any combination) satisfy the claim. For example, claim language reciting "at least one of A and B" or "at least one of A or B" means A, B, or A and B. In another example, claim language reciting "at least one of A, B, and C" or "at least one of A, B, or C" means A, B, C, or A and B, or A and C, or B and C, A and B and C, or any duplicate information or data (e.g., A and A, B and B, C and C, A and A and B, and so on), or any other ordering, duplication, or combination of A, B, and C. The language "at least one of" a set and/or "one or more" of a set does not limit the set to the items listed in the set. For example, claim language reciting "at least one of A and B" or "at least one of A or B" may mean A, B, or A and B, and may additionally include items not listed in the set of A and B. The phrases "at least one" and "one or more" are used interchangeably herein.

Claim language or other language reciting "at least one processor configured to," "at least one processor being configured to," "one or more processors configured to," "one or more processors being configured to," or the like indicates that one processor or multiple processors (in any combination) can perform the associated operation(s). For example, claim language reciting "at least one processor configured to: X, Y, and Z" means a single processor can be used to perform operations X, Y, and Z; or that multiple processors are each tasked with a certain subset of operations X, Y, and Z such that together the multiple processors perform X, Y, and Z; or that a group of multiple processors work together to perform operations X, Y, and Z. In another example, claim language reciting "at least one processor configured to: X, Y, and Z" can mean that any single processor may only perform at least a subset of operations X, Y, and Z.

Where reference is made to one or more elements performing functions (e.g., steps of a method), one element may perform all functions, or more than one element may collectively perform the functions. When more than one element collectively performs the functions, each function need not be performed by each of those elements (e.g., different functions may be performed by different elements) and/or each function need not be performed in whole by only one element (e.g., different elements may perform different sub-functions of a function). Similarly, where reference is made to one or more elements configured to cause another element (e.g., an apparatus) to perform functions, one element may be configured to cause the other element to perform all functions, or more than one element may collectively be configured to cause the other element to perform the functions.

Where reference is made to an entity (e.g., any entity or device described herein) performing functions or being configured to perform functions (e.g., steps of a method), the entity may be configured to cause one or more elements (individually or collectively) to perform the functions. The one or more components of the entity may include at least one memory, at least one processor, at least one communication interface, another component configured to perform one or more (or all) of the functions, and/or any combination thereof. Where reference to the entity performing functions, the entity may be configured to cause one component to perform all functions, or to cause more than one component to collectively perform the functions. When the entity is configured to cause more than one component to collectively perform the functions, each function need not be performed by each of those components (e.g., different functions may be performed by different components) and/or each function need not be performed in whole by only one component (e.g., different components may perform different sub-functions of a function).

Illustrative aspects of the disclosure include:

Aspect 1. An apparatus comprising: at least one memory; and at least one processor coupled to the at least one memory and configured to: configure a first device of a plurality of devices attached to a transmission line to create a first short across the transmission line at a location of the first device along a length of the transmission line, wherein each device of the plurality of devices is attached to a respective location along the length of the transmission line between a first end and a second end of the transmission line; inject a first pulse signal into the first end of the transmission line; measure a peak voltage of a first difference signal at the first end of the transmission line, the first difference signal resulting from a reflection of the first pulse signal by the first short; configure a second device attached to the transmission line to create a second short across the transmission line, wherein a location of the second device and the second short is farther from the first end of the transmission line than the location of the first device and the first short; configure the first device to inject a second pulse signal into the transmission line at the location of the first device along the length of the transmission line; measure a peak voltage of a second difference signal at the first end of the transmission line, the second difference signal resulting from the second pulse signal and a reflection of the second pulse signal by the second short; and determine the location of the first device along the length of the transmission line based on a first distance estimate using the peak voltage of the first difference signal and a second distance estimate using the peak voltage of the second difference signal.

Aspect 2. The apparatus of Aspect 1, wherein each device of the plurality of devices includes: a controllable short circuit configured to create a respective short across the transmission line at the respective location of each device along the length of the transmission line; and a pulse circuit configured to inject a respective pulse signal into the transmission line at the respective location of each device along the length of the transmission line.

Aspect 3. The apparatus of Aspect 2, wherein the at least one processor is further configured to determine the respective location of each device of the plurality of devices, based on: a respective first distance estimate determined from a respective peak voltage of a first difference signal determined using a controlled short caused by each device at the respective location of each device; and a respective second distance estimate determined from a respective peak voltage of a second difference signal determined using a pulse signal injected by each device at the respective location of each device.

Aspect 4. The apparatus of Aspect 3, wherein the respective location of each device comprises a weighted combination of the first distance estimate and the second distance estimate.

Aspect 5. The apparatus of Aspect 4, wherein: a respective weight for the first distance estimate is larger than a respective weight for the second distance estimate, based on the respective location of each device being closer to the first end of the transmission line than the second end of the transmission line; and the respective weight for the first distance estimate is smaller than the respective weight for the second distance estimate, based on the respective location of each device being closer to the second end of the transmission line than the first end of the transmission line.

Aspect 6. The apparatus of any of Aspects 1 to 5, wherein: the transmission line comprises a multi-conductor rail; and the plurality of devices comprises a plurality of Electronic Shelf Labels (ESLs) coupled to the multi-conductor rail.

Aspect 7. The apparatus of any of Aspects 1 to 6, wherein the peak voltage of the first difference signal and the peak voltage of the second difference signal are measured by a peak detection circuit coupled to the first end of the transmission line.

Aspect 8. The apparatus of Aspect 7, wherein the peak detection circuit includes a pulse circuit, and wherein the first pulse signal is injected using the pulse circuit.

Aspect 9. The apparatus of any of Aspects 1 to 8, wherein: the first pulse signal is injected in a forward direction along the length of the transmission line, wherein the forward direction is from the first end to the second end of the transmission line; and the reflection of the first pulse signal by the first short results in a first reflected reverse signal propagated in a reverse direction from the location of the first device to the first end of the transmission line.

Aspect 10. The apparatus of Aspect 9, wherein: the second pulse signal injected at the location of the first device results in a reverse pulse signal propagated in the reverse direction from the respective location of the first device, and a forward pulse signal propagated in the forward direction from the location of the first device; and the reflection of the second pulse signal by the second short comprises a reflection of the forward pulse signal into a second reflected reverse signal propagated in the reverse direction from the location of the second short.

Aspect 11. The apparatus of any of Aspects 1 to 10, wherein: the second device comprises a controllable short circuit device coupled to the second end of the transmission line; and the second device is not included in the plurality of devices.

Aspect 12. The apparatus of Aspect 11, wherein: the peak voltage of the first difference signal and the peak voltage of the second difference signal are measured by a peak detection circuit coupled to the first end of the transmission line; and the respective location of each device of the plurality of devices is along the length of the transmission line between the peak detection circuit at the first end of the transmission line and the controllable short circuit device at the second end of the transmission line.

Aspect 13. The apparatus of any of Aspects 1 to 12, wherein: the second device is included in the plurality of devices; the second device includes a controllable short circuit configured to create the second short across the transmission line at the location of the second device along the length of the transmission line; and the second device includes a pulse circuit configured to inject one or more pulse signals into the transmission line at the location of the second device along the length of the transmission line.

Aspect 14. The apparatus of any of Aspects 1 to 13, wherein the second device is selected from the plurality of devices based on the location of the second device being closer to the second end of the transmission line than the location of the first device to the second end of the transmission line.

Aspect 15. The apparatus of any of Aspects 1 to 14, wherein: the first device and the second device are selected from the plurality of devices as a random pair of devices; the at least one processor is configured to determine that a distance from the first end of the transmission line to the first device is smaller than a distance from the first end of the transmission line to the second device, based on detecting the second difference signal on the transmission line after injection of the second pulse signal; and the at least one processor is configured to determine that the distance from the first end of the transmission line to the first device is larger than the distance from the first end of the transmission line to the second device, based on not detecting the second difference signal on the transmission line after injection of the second pulse signal.

Aspect 16. The apparatus of Aspect 15, wherein the at least one processor is further configured to: determine a relative order of the plurality of devices along the length of the transmission line, based on selecting a plurality of random pairs of devices and detecting or not detecting a respective resulting second difference signal on the transmission line after injection of a respective second pulse signal by the first device of each random pair.

Aspect 17. A method comprising: configuring a first device of a plurality of devices attached to a transmission line to create a first short across the transmission line at a location of the first device along a length of the transmission line, wherein each device of the plurality of devices is attached to a respective location along the length of the transmission line between a first end and a second end of the transmission line; injecting a first pulse signal into the first end of the transmission line; measuring a peak voltage of a first difference signal at the first end of the transmission line, the first difference signal resulting from a reflection of the first pulse signal by the first short; configuring a second device attached to the transmission line to create a second short across the transmission line, wherein a location of the second device and the second short is farther from the first end of the transmission line than the location of the first device and the first short; configuring the first device to inject a second pulse signal into the transmission line at the location of the first device along the length of the transmission line; measuring a peak voltage of a second difference signal at the first end of the transmission line, the second difference signal resulting from the second pulse signal and a reflection of the second pulse signal by the second short; and determining the location of the first device along the length of the transmission line based on a first distance estimate using the peak voltage of the first difference signal and a second distance estimate using the peak voltage of the second difference signal.

Aspect 18. The method of Aspect 17, wherein each device of the plurality of devices includes: a controllable short circuit configured to create a respective short across the transmission line at the respective location of each device along the length of the transmission line; and a pulse circuit configured to inject a respective pulse signal into the transmission line at the respective location of each device along the length of the transmission line.

Aspect 19. The method of Aspect 18, further comprising determining the respective location of each device of the plurality of devices, based on: a respective first distance estimate determined from a respective peak voltage of a first difference signal determined using a controlled short caused by each device at the respective location of each device; and a respective second distance estimate determined from a respective peak voltage of a second difference signal determined using a pulse signal injected by each device at the respective location of each device.

Aspect 20. The method of Aspect 19, wherein the respective location of each device comprises a weighted combination of the first distance estimate and the second distance estimate.

Aspect 21. The method of Aspect 20, wherein: a respective weight for the first distance estimate is larger than a respective weight for the second distance estimate, based on the respective location of each device being closer to the first end of the transmission line than the second end of the transmission line; and the respective weight for the first distance estimate is smaller than the respective weight for the second distance estimate, based on the respective location of each device being closer to the second end of the transmission line than the first end of the transmission line.

Aspect 22. The method of any of Aspects 17 to 21, wherein: the transmission line comprises a multi-conductor rail; and the plurality of devices comprises a plurality of Electronic Shelf Labels (ESLs) coupled to the multi-conductor rail.

Aspect 23. The method of any of Aspects 17 to 22, wherein the peak voltage of the first difference signal and the peak voltage of the second difference signal are measured by a peak detection circuit coupled to the first end of the transmission line.

Aspect 24. The method of Aspect 23, wherein the peak detection circuit includes a pulse circuit, and wherein the first pulse signal is injected using the pulse circuit.

Aspect 25. The method of any of Aspects 17 to 24, wherein: the first pulse signal is injected in a forward direction along the length of the transmission line, wherein the forward direction is from the first end to the second end of the transmission line; and the reflection of the first pulse signal by the first short results in a first reflected reverse signal propagated in a reverse direction from the location of the first device to the first end of the transmission line.

Aspect 26. The method of Aspect 25, wherein: the second pulse signal injected at the location of the first device results in a reverse pulse signal propagated in the reverse direction from the respective location of the first device, and a forward pulse signal propagated in the forward direction from the location of the first device; and the reflection of the second pulse signal by the second short comprises a reflection of the forward pulse signal into a second reflected reverse signal propagated in the reverse direction from the location of the second short.

Aspect 27. The method of any of Aspects 17 to 26, wherein: the second device comprises a controllable short circuit device coupled to the second end of the transmission line; and the second device is not included in the plurality of devices.

Aspect 28. The method of Aspect 27, wherein: the peak voltage of the first difference signal and the peak voltage of the second difference signal are measured by a peak detection circuit coupled to the first end of the transmission line; and the respective location of each device of the plurality of devices is along the length of the transmission line between the peak detection circuit at the first end of the transmission line and the controllable short circuit device at the second end of the transmission line.

Aspect 29. The method of any of Aspects 17 to 28, wherein: the second device is included in the plurality of devices; the second device includes a controllable short circuit configured to create the second short across the transmission line at the location of the second device along the length of the transmission line; and the second device includes a pulse circuit configured to inject one or more pulse signals into the transmission line at the location of the second device along the length of the transmission line.

Aspect 30. The method of any of Aspects 17 to 29, wherein the second device is selected from the plurality of devices based on the location of the second device being closer to the second end of the transmission line than the location of the first device to the second end of the transmission line.

Aspect 31. The method of any of Aspects 17 to 30, wherein the first device and the second device are selected from the plurality of devices as a random pair of devices, and the method further comprising: determining that a distance from the first end of the transmission line to the first device is smaller than a distance from the first end of the transmission line to the second device, based on detecting the second difference signal on the transmission line after injection of the second pulse signal; and determining that the distance from the first end of the transmission line to the first device is larger than the distance from the first end of the transmission line to the second device, based on not detecting the second difference signal on the transmission line after injection of the second pulse signal.

Aspect 32. The method of Aspect 31, further comprising: determining a relative order of the plurality of devices along the length of the transmission line, based on selecting a plurality of random pairs of devices and detecting or not detecting a respective resulting second difference signal on the transmission line after injection of a respective second pulse signal by the first device of each random pair.

Aspect 33. A non-transitory computer-readable storage medium comprising instructions stored thereon which, when executed by at least one processor, causes the at least one processor to perform operations according to any of Aspects 1 to 16.

Aspect 34. A non-transitory computer-readable storage medium comprising instructions stored thereon which, when executed by at least one processor, causes the at least one processor to perform operations according to any of Aspects 17 to 32.

Aspect 35. An apparatus for wireless communications comprising one or more means for performing operations according to any of Aspects 1 to 16.

Aspect 36. An apparatus for wireless communications comprising one or more means for performing operations according to any of Aspects 17 to 32.

What is claimed is:

1. An apparatus comprising:

at least one memory; and at least one processor coupled to the at least one memory and configured to:

configure a first device of a plurality of devices attached to a transmission line to create a first short across the transmission line at a location of the first device along a length of the transmission line, wherein each device of the plurality of devices is attached to a respective location along the length of the transmission line between a first end and a second end of the transmission line;

inject a first pulse signal into the first end of the transmission line;

measure a peak voltage of a first difference signal at the first end of the transmission line, the first difference signal resulting from a reflection of the first pulse signal by the first short;

configure a second device attached to the transmission line to create a second short across the transmission line, wherein a location of the second device and the second short is farther from the first end of the transmission line than the location of the first device and the first short;

configure the first device to inject a second pulse signal into the transmission line at the location of the first device along the length of the transmission line;

measure a peak voltage of a second difference signal at the first end of the transmission line, the second difference signal resulting from the second pulse signal and a reflection of the second pulse signal by the second short; and determine the location of the first device along the length of the transmission line based on a first distance estimate using the peak voltage of the first difference signal and a second distance estimate using the peak voltage of the second difference signal.

2. The apparatus of claim 1, wherein each device of the plurality of devices includes:

a controllable short circuit configured to create a respective short across the transmission line at the respective location of each device along the length of the transmission line; and a pulse circuit configured to inject a respective pulse signal into the transmission line at the respective location of each device along the length of the transmission line.

3. The apparatus of claim 2, wherein the at least one processor is further configured to determine the respective location of each device of the plurality of devices, based on:

a respective first distance estimate determined from a respective peak voltage of a first difference signal determined using a controlled short caused by each device at the respective location of each device; and a respective second distance estimate determined from a respective peak voltage of a second difference signal determined using a pulse signal injected by each device at the respective location of each device.

4. The apparatus of claim 3, wherein the respective location of each device comprises a weighted combination of the first distance estimate and the second distance estimate.

5. The apparatus of claim 4, wherein:

a respective weight for the first distance estimate is larger than a respective weight for the second distance estimate, based on the respective location of each device being closer to the first end of the transmission line than the second end of the transmission line; and the respective weight for the first distance estimate is smaller than the respective weight for the second distance estimate, based on the respective location of each device being closer to the second end of the transmission line than the first end of the transmission line.

6. The apparatus of claim 1, wherein:

the transmission line comprises a multi-conductor rail; and the plurality of devices comprises a plurality of Electronic Shelf Labels (ESLs) coupled to the multi-conductor rail.

7. The apparatus of claim 1, wherein the peak voltage of the first difference signal and the peak voltage of the second difference signal are measured by a peak detection circuit coupled to the first end of the transmission line.

8. The apparatus of claim 7, wherein the peak detection circuit includes a pulse circuit, and wherein the first pulse signal is injected using the pulse circuit.

9. The apparatus of claim 1, wherein:

the first pulse signal is injected in a forward direction along the length of the transmission line, wherein the forward direction is from the first end to the second end of the transmission line; and the reflection of the first pulse signal by the first short results in a first reflected reverse signal propagated in a reverse direction from the location of the first device to the first end of the transmission line.

10. The apparatus of claim 9, wherein:

the second pulse signal injected at the location of the first device results in a reverse pulse signal propagated in the reverse direction from the respective location of the first device, and a forward pulse signal propagated in the forward direction from the location of the first device; and the reflection of the second pulse signal by the second short comprises a reflection of the forward pulse signal into a second reflected reverse signal propagated in the reverse direction from the location of the second short.

11. The apparatus of claim 1, wherein:

the second device comprises a controllable short circuit device coupled to the second end of the transmission line; and the second device is not included in the plurality of devices.

12. The apparatus of claim 11, wherein:

the peak voltage of the first difference signal and the peak voltage of the second difference signal are measured by a peak detection circuit coupled to the first end of the transmission line; and the respective location of each device of the plurality of devices is along the length of the transmission line between the peak detection circuit at the first end of the transmission line and the controllable short circuit device at the second end of the transmission line.

13. The apparatus of claim 1, wherein:

the second device is included in the plurality of devices;

the second device includes a controllable short circuit configured to create the second short across the transmission line at the location of the second device along the length of the transmission line; and the second device includes a pulse circuit configured to inject one or more pulse signals into the transmission line at the location of the second device along the length of the transmission line.

14. The apparatus of claim 1, wherein the second device is selected from the plurality of devices based on the location of the second device being closer to the second end of the transmission line than the location of the first device to the second end of the transmission line.

15. The apparatus of claim 1, wherein:

the first device and the second device are selected from the plurality of devices as a random pair of devices;

the at least one processor is configured to determine that a distance from the first end of the transmission line to the first device is smaller than a distance from the first end of the transmission line to the second device, based on detecting the second difference signal on the transmission line after injection of the second pulse signal; and the at least one processor is configured to determine that the distance from the first end of the transmission line to the first device is larger than the distance from the first end of the transmission line to the second device, based on not detecting the second difference signal on the transmission line after injection of the second pulse signal.

16. The apparatus of claim 15, wherein the at least one processor is further configured to:

determine a relative order of the plurality of devices along the length of the transmission line, based on selecting a plurality of random pairs of devices and detecting or not detecting a respective resulting second difference signal on the transmission line after injection of a respective second pulse signal by the first device of each random pair.

17. A method comprising:

configuring a first device of a plurality of devices attached to a transmission line to create a first short across the transmission line at a location of the first device along a length of the transmission line, wherein each device of the plurality of devices is attached to a respective location along the length of the transmission line between a first end and a second end of the transmission line;

injecting a first pulse signal into the first end of the transmission line;

measuring a peak voltage of a first difference signal at the first end of the transmission line, the first difference signal resulting from a reflection of the first pulse signal by the first short;

configuring a second device attached to the transmission line to create a second short across the transmission line, wherein a location of the second device and the second short is farther from the first end of the transmission line than the location of the first device and the first short;

configuring the first device to inject a second pulse signal into the transmission line at the location of the first device along the length of the transmission line;

measuring a peak voltage of a second difference signal at the first end of the transmission line, the second difference signal resulting from the second pulse signal and a reflection of the second pulse signal by the second short; and determining the location of the first device along the length of the transmission line based on a first distance estimate using the peak voltage of the first difference signal and a second distance estimate using the peak voltage of the second difference signal.

18. The method of claim 17, wherein each device of the plurality of devices includes:

a controllable short circuit configured to create a respective short across the transmission line at the respective location of each device along the length of the transmission line; and a pulse circuit configured to inject a respective pulse signal into the transmission line at the respective location of each device along the length of the transmission line.

19. The method of claim 18, further comprising determining the respective location of each device of the plurality of devices, based on:

a respective first distance estimate determined from a respective peak voltage of a first difference signal determined using a controlled short caused by each device at the respective location of each device; and a respective second distance estimate determined from a respective peak voltage of a second difference signal determined using a pulse signal injected by each device at the respective location of each device.

20. The method of claim 17, wherein:

the transmission line comprises a multi-conductor rail; and the plurality of devices comprises a plurality of Electronic Shelf Labels (ESLs) coupled to the multi-conductor rail.

* * * * *